(12) United States Patent
Yamazaki et al.

(10) Patent No.: US 11,519,785 B2
(45) Date of Patent: Dec. 6, 2022

(54) LIGHT DETECTOR

(71) Applicant: HAMAMATSU PHOTONICS K.K., Hamamatsu (JP)

(72) Inventors: Masahiro Yamazaki, Hamamatsu (JP); Katsumi Shibayama, Hamamatsu (JP); Ryusuke Kitaura, Hamamatsu (JP); Ryosuke Koike, Hamamatsu (JP); Go Tanaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/636,539

(22) PCT Filed: Jul. 24, 2018

(86) PCT No.: PCT/JP2018/027734
§ 371 (c)(1),
(2) Date: Feb. 4, 2020

(87) PCT Pub. No.: WO2019/031234
PCT Pub. Date: Feb. 14, 2019

(65) Prior Publication Data
US 2020/0249094 A1    Aug. 6, 2020

(30) Foreign Application Priority Data
Aug. 10, 2017  (JP) .............................. JP2017-155977

(51) Int. Cl.
*G01J 5/20*       (2006.01)
*G01J 1/02*       (2006.01)
(Continued)

(52) U.S. Cl.
CPC . *G01J 5/20* (2013.01); *G01J 1/02* (2013.01); *G01J 5/024* (2013.01); *G01J 5/046* (2013.01);
(Continued)

(58) Field of Classification Search
None
See application file for complete search history.

(56) References Cited

U.S. PATENT DOCUMENTS 7,541,583 B2 *   6/2009   Tohyama .................. G01J 5/10
                                                        250/338.1
2006/0054823 A1   3/2006   Yon et al.
(Continued)

FOREIGN PATENT DOCUMENTS

| CN | 1337002 A | 2/2002 |
| CN | 101038210 A | 9/2007 |

(Continued)

OTHER PUBLICATIONS

International Preliminary Report on Patentability dated Feb. 20, 2020 for PCT/JP2018/027734.

*Primary Examiner* — Edwin C Gunberg
(74) *Attorney, Agent, or Firm* — Faegre Drinker Biddle & Reath LLP

(57) ABSTRACT

A light detector includes a substrate, a membrane disposed on a surface of the substrate, a first and a second electrode post supporting the membrane. The first electrode post includes a first main body portion having a tubular shape spreading from a first electrode pad toward a side opposite to the substrate, and a first flange portion provided in an end portion at the side opposite to the substrate in the first main body portion. The first flange portion is provided with a first sloped surface inclined so as to approach the substrate as it goes away from the first main body portion. A first wiring layer reaches an inner surface of the first main body portion through the first sloped surface. The second electrode post and the second wiring layer are formed similarly to the first electrode post and the first wiring layer.

7 Claims, 17 Drawing Sheets

(51) Int. Cl.
  *G01J 5/02*   (2022.01)
  *G01J 5/04*   (2006.01)
  *H01L 27/144*  (2006.01)
  *H01L 31/0232*  (2014.01)
  *H01L 31/0248*  (2006.01)
  *H01L 31/09*  (2006.01)

(52) U.S. Cl.
  CPC ........ *H01L 27/144* (2013.01); *H01L 31/0248* (2013.01); *H01L 31/02327* (2013.01); *H01L 31/09* (2013.01)

(56) References Cited

U.S. PATENT DOCUMENTS

2009/0140148 A1 6/2009 Yang et al.
2011/0042569 A1 2/2011 Cho et al.

FOREIGN PATENT DOCUMENTS

| EP | 3088856 A1 | 11/2016 |
|---|---|---|
| JP | H11-004023 A | 1/1999 |
| JP | 2003-532067 A | 10/2003 |
| JP | 2011-054974 A | 3/2011 |
| WO | WO-01/081879 A2 | 11/2001 |
| WO | WO-2010/079686 A1 | 7/2010 |
| WO | WO 2017/007373 A1 | 1/2017 |

* cited by examiner

*Fig.8*
(a)
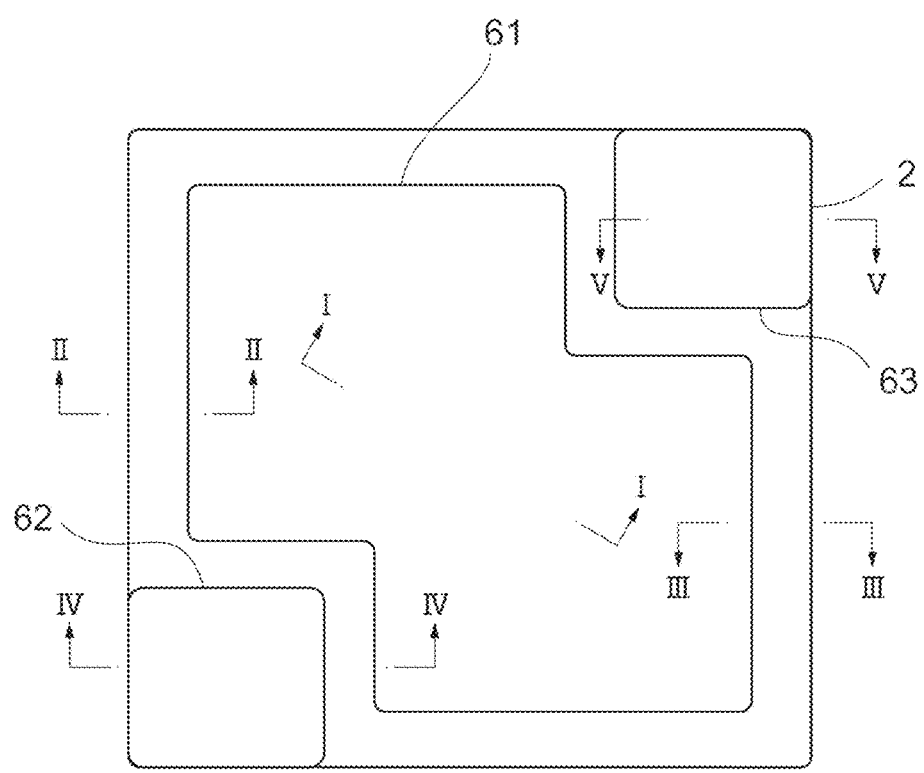
(b)
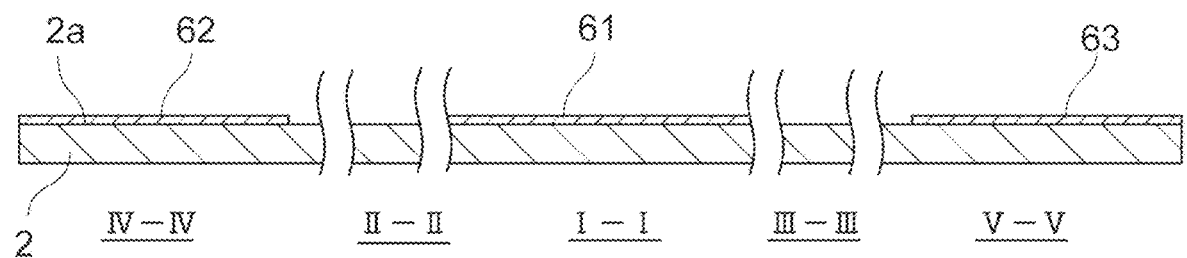

*Fig.9*
(a)
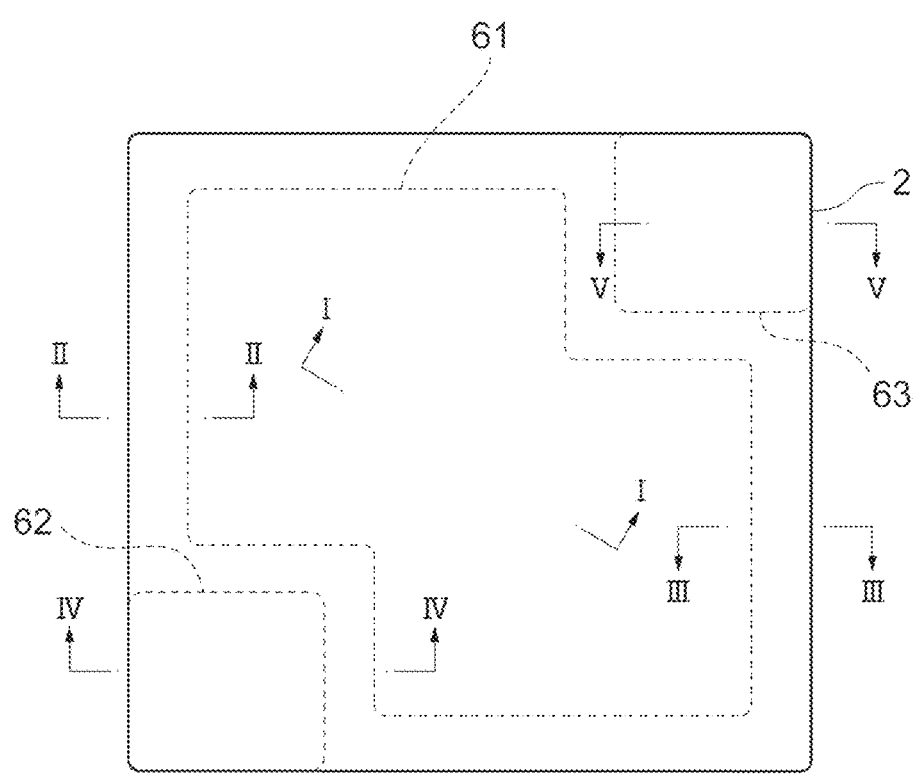
(b)
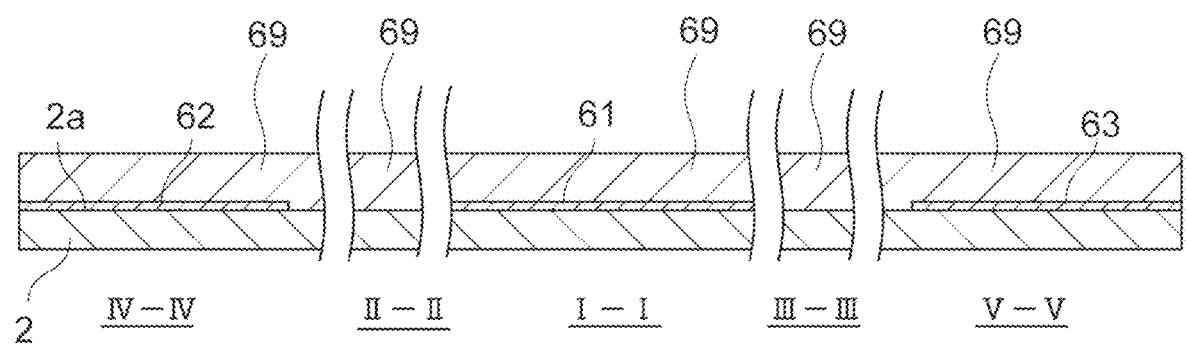

*Fig.10*
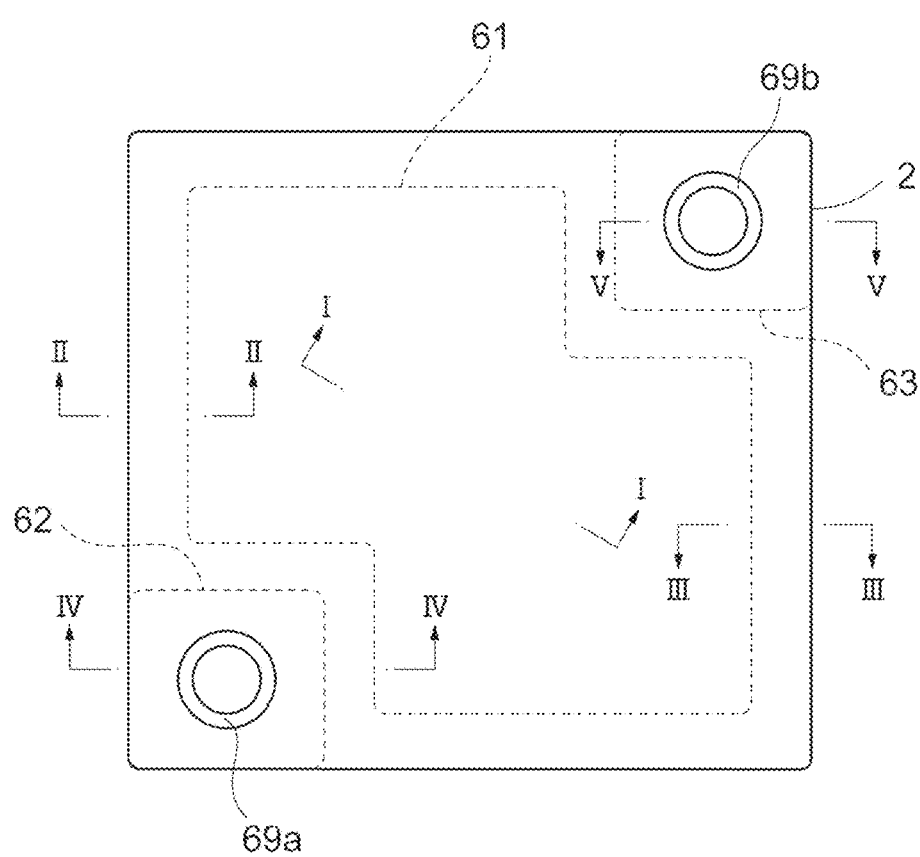
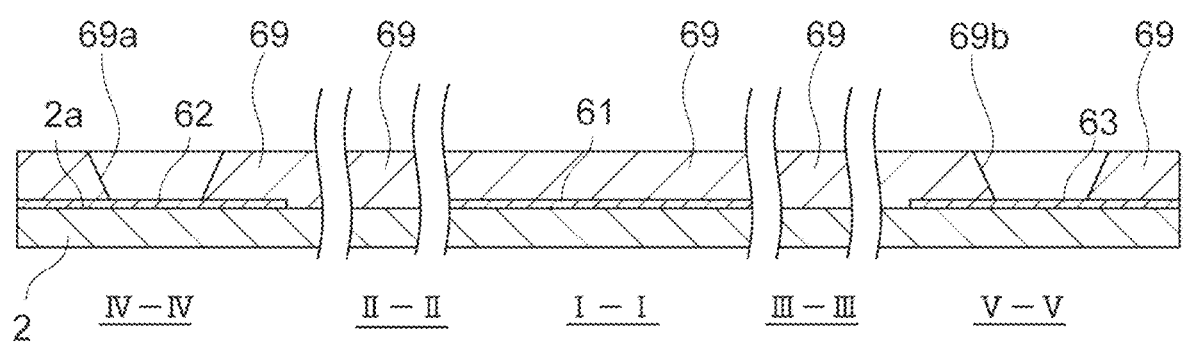

*Fig.11*
(a)
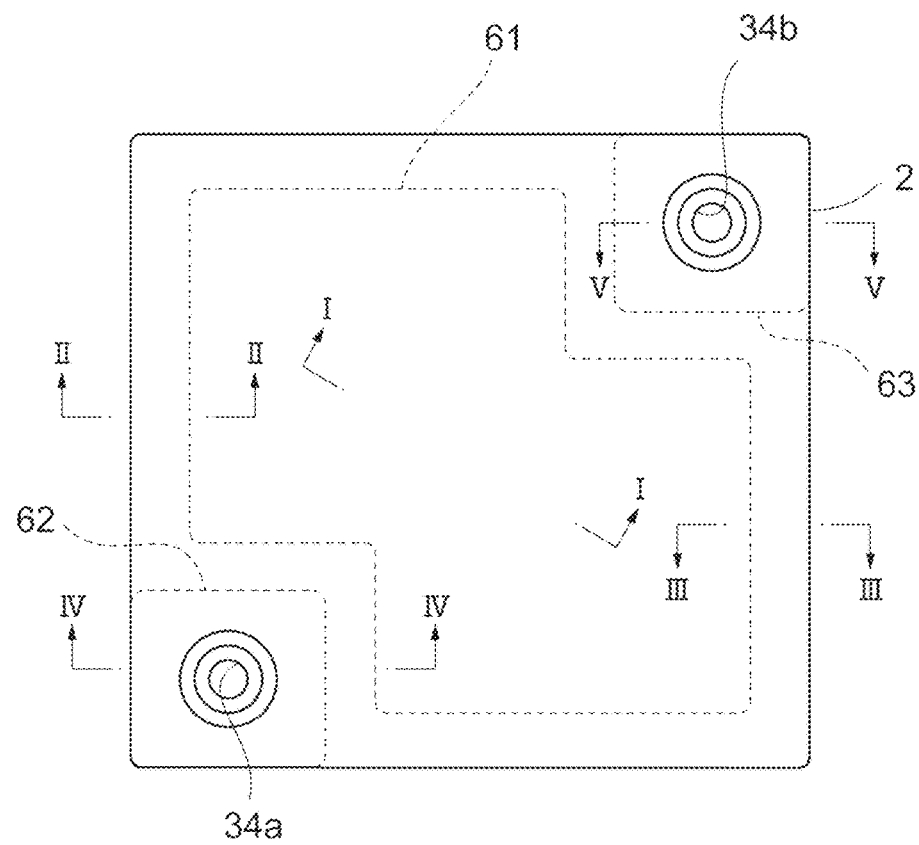
(b)
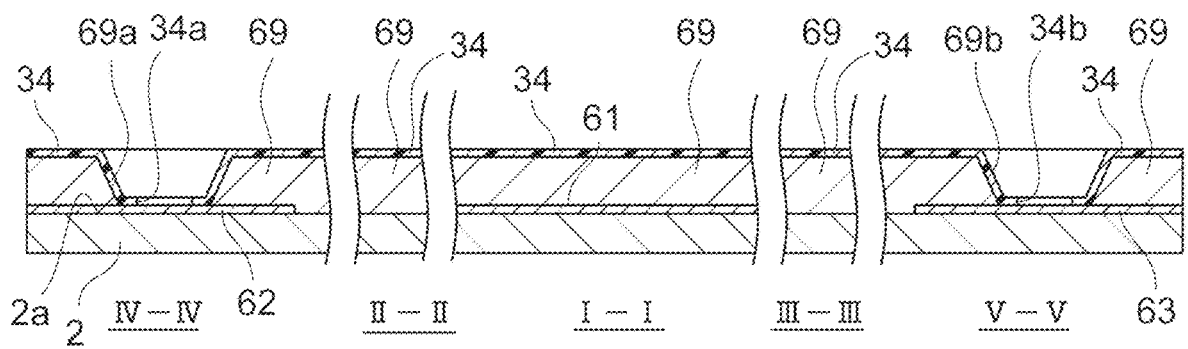

Fig.13
(a)
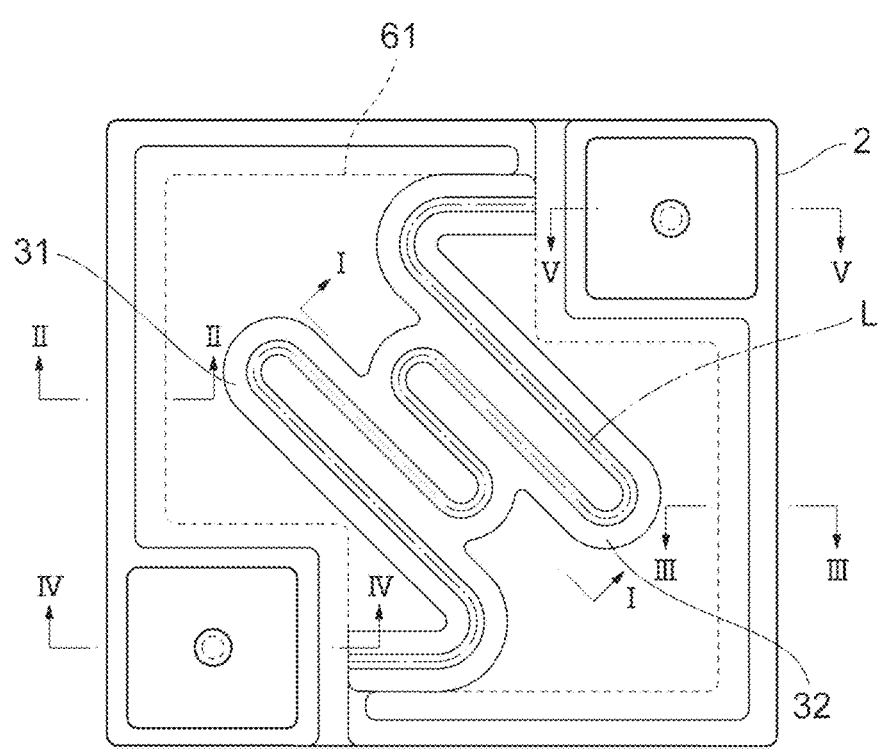
(b)
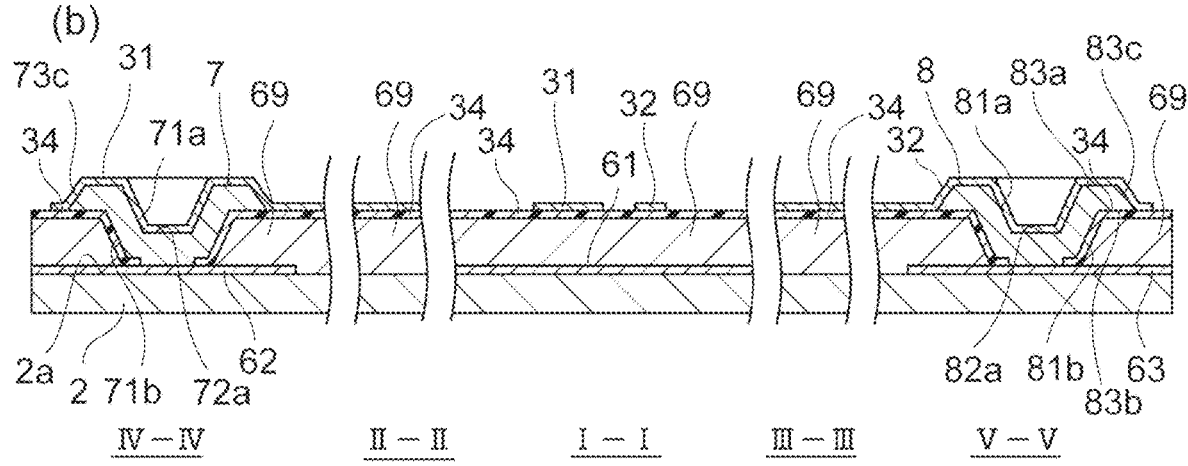

Fig.14
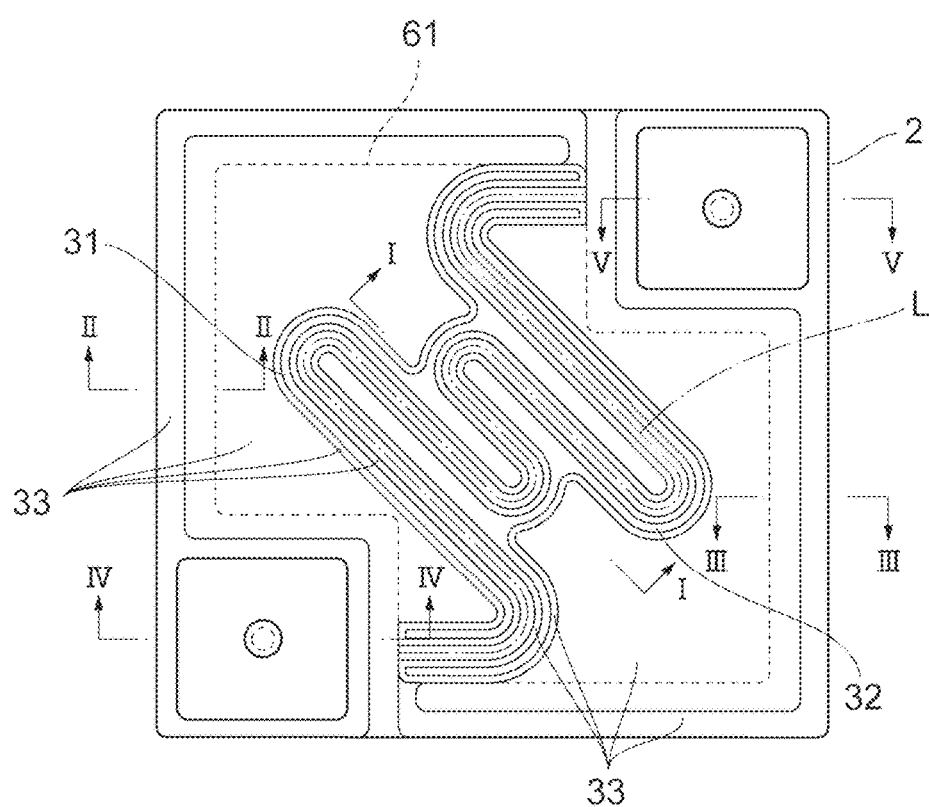
(a)
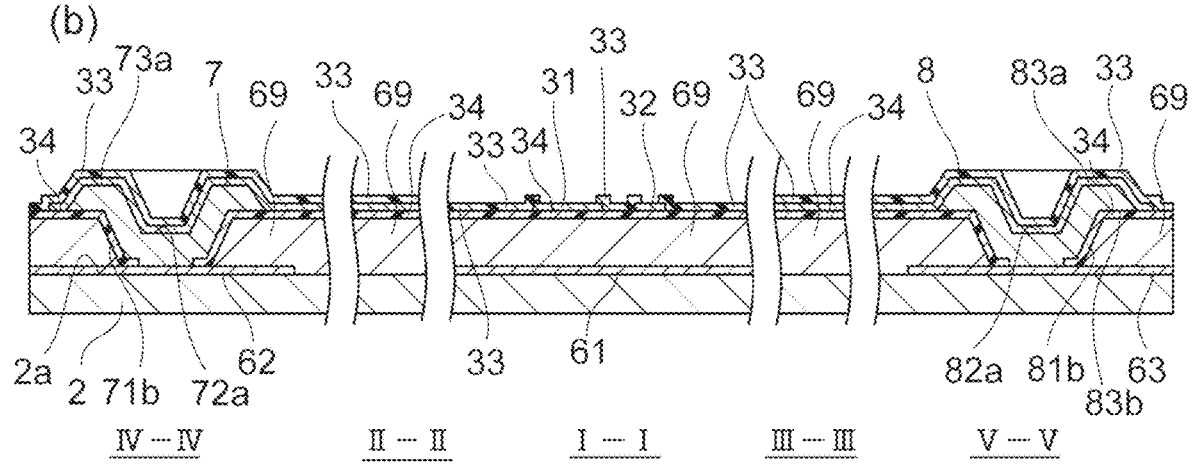
(b)

Fig.15
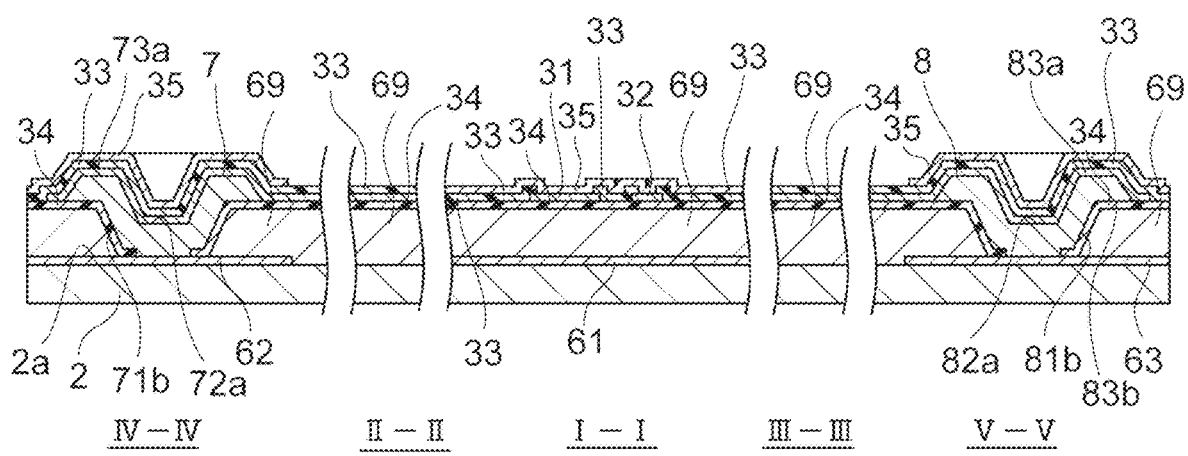
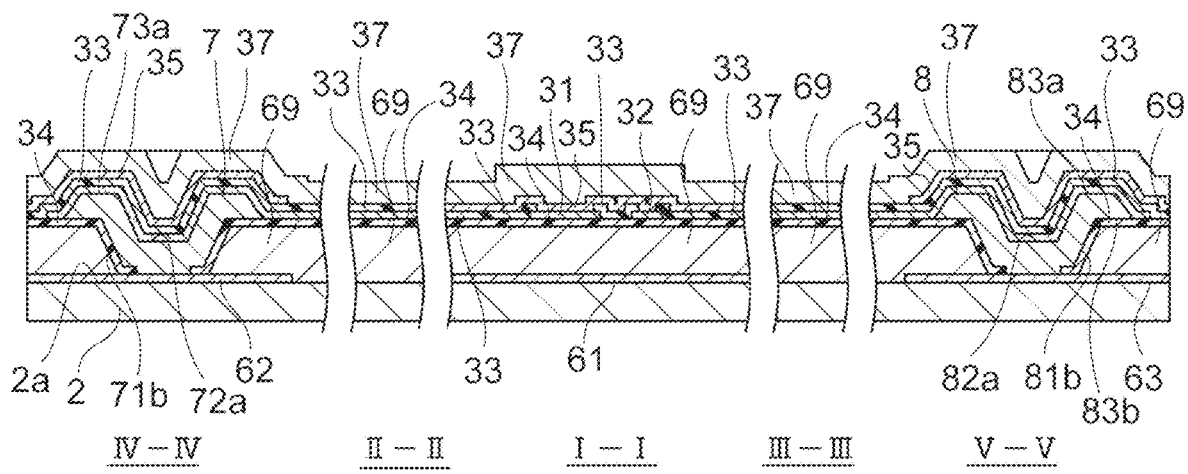

*Fig.16*
(a)
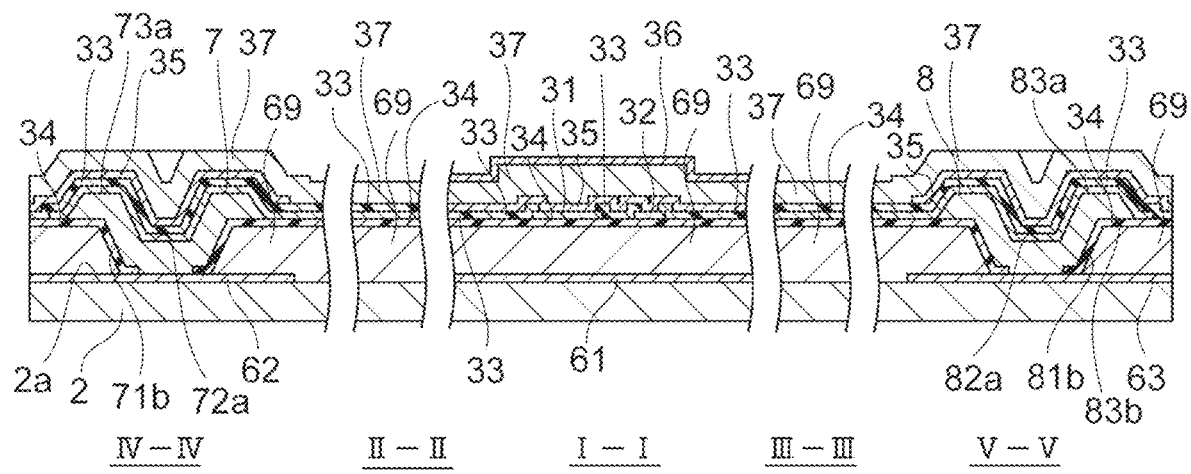
(b)
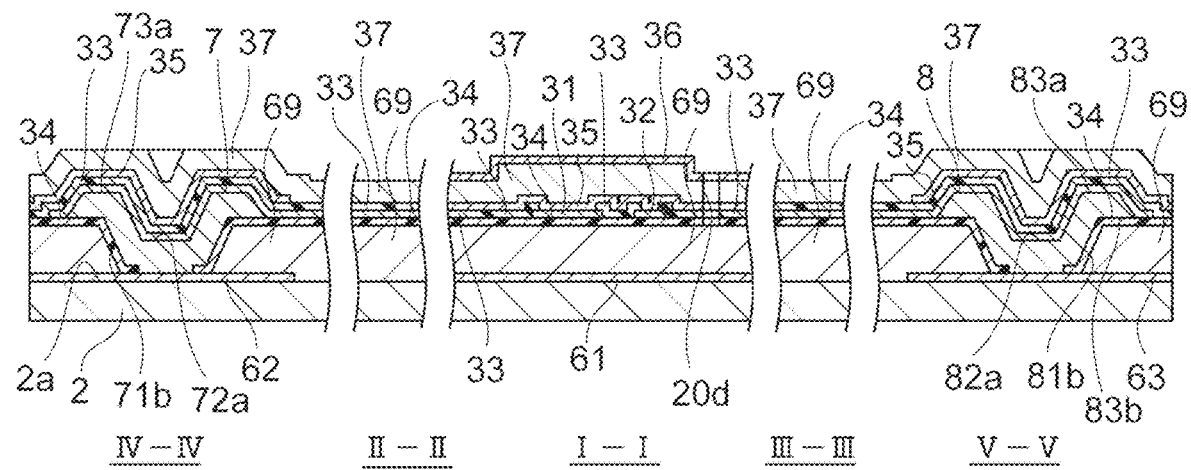

*Fig.17*
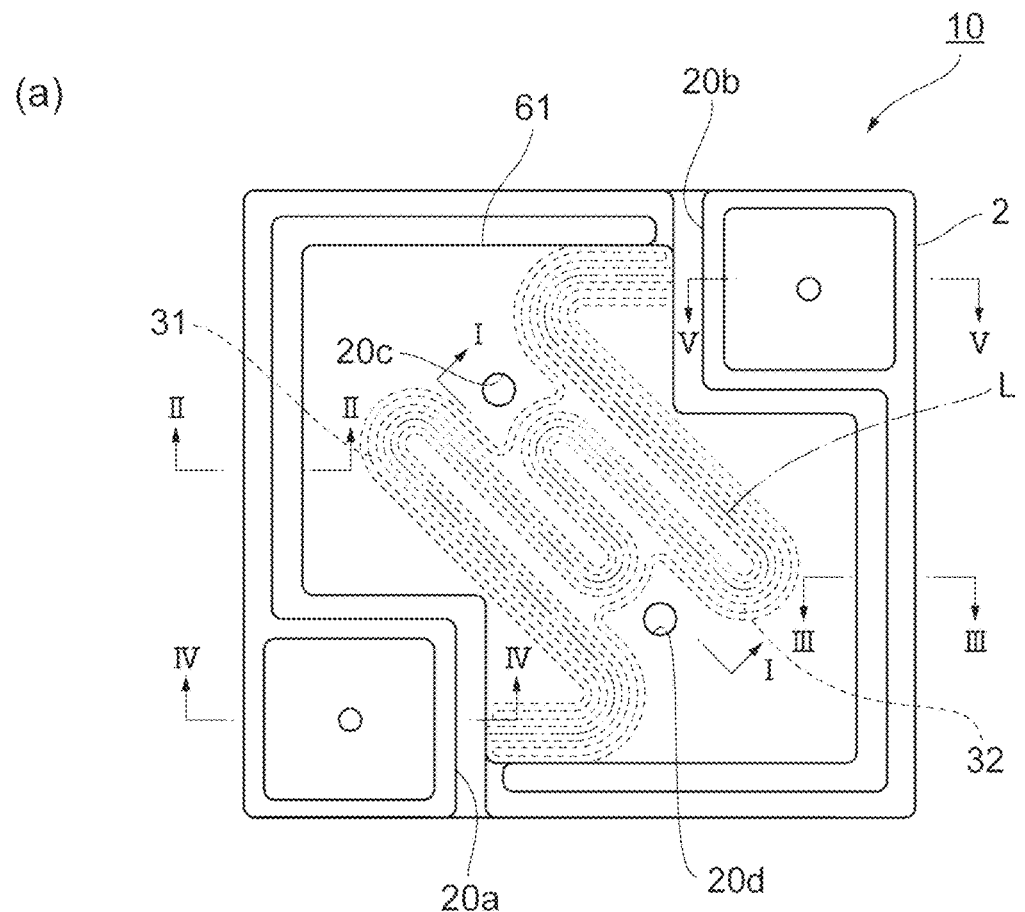
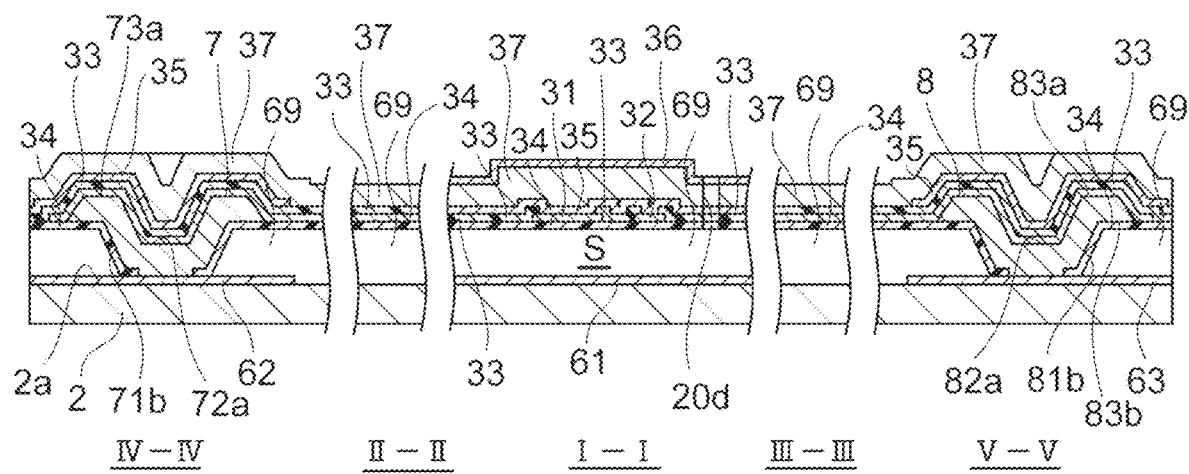

LIGHT DETECTOR

TECHNICAL FIELD

The present disclosure relates to a light detector.

BACKGROUND ART

As a light detector, there is known one including a substrate, a membrane disposed on a surface of the substrate so as to form a void space between the membrane and the surface of the substrate, and a pair of electrode posts supporting the membrane and the membrane includes a pair of wiring layers facing each other with a gap interposed therebetween and a resistance layer having an electrical resistance depending on a temperature. In such a light detector, the electrode post has a cylindrical shape and the wiring layer is electrically connected to the electrode post in a connection portion of the electrode post in the membrane (for example, see Patent Literature 1).

CITATION LIST

Patent Literature

Patent Literature 1: US Unexamined Patent Publication No. 2011/42569

SUMMARY OF INVENTION

Technical Problem

In the above-described light detector, since an outer surface of the electrode post intersects vertically a surface at the side of the substrate in the connection portion of the membrane, stress concentration easily occurs at the intersection portion. As a result, there is concern that an electrical connection error occurs in the connection portion of the membrane, the connection portion to which the electrode post is connected.

Here, an object of the present disclosure is to provide a light detector capable of suppressing an electrical connection error in a connection portion of the membrane, the connection portion to which the electrode post is connected.

Solution to Problem

A light detector of an aspect of the present disclosure includes a substrate; a membrane which includes a light receiving portion, first and second connection portions, a first beam portion disposed between the light receiving portion and the first connection portion, and a second beam portion disposed between the light receiving portion and the second connection portion and is disposed on a surface of the substrate so that a void space is formed between the membrane and the surface of the substrate; a first electrode pad which is formed on the surface of the substrate; a second electrode pad which is formed on the surface of the substrate; a first electrode post which is disposed between the first electrode pad and the first connection portion so as to support the membrane and to electrically connect the membrane to the first electrode pad; and a second electrode post which is disposed between the second electrode pad and the second connection portion so as to support the membrane and to electrically connect the membrane to the second electrode pad, in which the membrane includes first and second wiring layers facing each other with a gap interposed therebetween in the light receiving portion and a resistance layer having an electrical resistance depending on a temperature and electrically connected to each of the first and second wiring layers in the light receiving portion, in which the first electrode post includes a first main body portion having a tubular shape spreading from the first electrode pad toward the side opposite to the substrate, a first bottom portion provided in an end portion at the side of the substrate in the first main body portion, and a first flange portion provided in an end portion at the side opposite to the substrate in the first main body portion, in which the first flange portion is provided with a first sloped surface inclined so as to approach the substrate as it goes away from the first main body portion, in which the first wiring layer extends to the first connection portion through the first beam portion and reaches an inner surface of the first main body portion through the first sloped surface, in which the second electrode post includes a second main body portion having a tubular shape spreading from the second electrode pad toward the side opposite to the substrate, a second bottom portion provided in an end portion at the side of the substrate in the second main body portion, and a second flange portion provided in an end portion at the side opposite to the substrate in the second main body portion, in which the second flange portion is provided with a second sloped surface inclined so as to approach the substrate as it goes away from the second main body portion, and in which the second wiring layer extends to the second connection portion through the second beam portion and reaches an inner surface of the second main body portion through the second sloped surface.

In the light detector, the first main body portion of the first electrode post has a tubular shape spreading from the first electrode pad toward the side opposite to the substrate. For this reason, stress concentration hardly occurs in the first connection portion of the membrane, the first connection portion to which the first electrode post is connected. The same applies to the second electrode post and stress concentration hardly occurs the second connection portion of the membrane, the second connection portion to which the second electrode post is connected. Further, the first flange portion is provided in an end portion at the side opposite to the substrate in the first main body portion of the first electrode post. For this reason, deformation hardly occurs in the first connection portion of the membrane, the first connection portion to which the first electrode post is connected. The same applies to the second electrode post and deformation hardly occurs in the second connection portion of the membrane, the second connection portion to which the second electrode post is connected. Further, the first wiring layer reaches the inner surface of the first main body portion through the first sloped surface provided in the first flange portion. For this reason, stress concentration hardly occurs in the first wiring layer itself at the first connection portion of the membrane, the first connection portion to which the first electrode post is connected. The same applies to the second electrode post and stress concentration hardly occurs in the second wiring layer itself at the second connection portion of the membrane, the second connection portion to which the second electrode post is connected. As described above, according to the light detector, it is possible to suppress an electrical connection error in the connection portion of the membrane, the connection portion to which the electrode post is connected.

In the light detector of an aspect of the present disclosure, the first wiring layer may reach the inner surface of the first main body portion and an inner surface of the first bottom portion through the first sloped surface and the second wiring layer may reach the inner surface of the second main body portion and an inner surface of the second bottom portion through the second sloped surface. According to this configuration, it is possible to secure the electrical connection between the first wiring layer and the first electrode post and the electrical connection between the second wiring layer and the second electrode post.

In the light detector of an aspect of the present disclosure, the first sloped surface may be provided in an annular shape along an outer edge of the first flange portion, the first wiring layer may cover the first sloped surface and the inner surface of the first main body portion, the second sloped surface may be provided in an annular shape along an outer edge of the second flange portion, and the second wiring layer may cover the second sloped surface and the inner surface of the second main body portion. According to this configuration, it is possible to further secure the electrical connection between the first wiring layer and the first electrode post and the electrical connection between the second wiring layer and the second electrode post.

In the light detector of an aspect of the present disclosure, the membrane may further include a first insulation layer formed on a surface at the side opposite to the substrate in the first wiring layer and the second wiring layer and the first insulation layer may cover a side surface of the first wiring layer in the first connection portion and cover a side surface of the second wiring layer in the second connection portion. According to this configuration, it is possible to prevent the separation of the first wiring layer in the first connection portion and the separation of the second wiring layer in the second connection portion while protecting the first wiring layer and the second wiring layer from the side opposite to the substrate.

In the light detector of an aspect of the present disclosure, the membrane may further include a second insulation layer formed on a surface at the side of the substrate in the first wiring layer and the second wiring layer and the second insulation layer may enter a groove formed in an outer surface of the first bottom portion on the first electrode pad through an outer surface of the first main body portion and enter a groove formed in an outer surface of the second bottom portion on the second electrode pad through an outer surface of the second main body portion. According to this configuration, it is possible to prevent the separation of the second insulation layer on the first electrode pad or the exposure of the outer surface of the first electrode post and the separation of the second insulation layer on the second electrode pad or the exposure of the outer surface of the second electrode post while protecting the first wiring layer and the second wiring layer from the substrate.

In the light detector of an aspect of the present disclosure, the resistance layer may be provided in the light receiving portion, the first connection portion, and the second connection portion and may be divided in each of the first beam portion and the second beam portion. According to this configuration, since the first connection portion and the second connection portion are reinforced by the resistance layer, it is possible to more reliably suppress an electrical connection error in the connection portion of the membrane, the connection portion to which the electrode post is connected. Further, since the resistance layer is divided in the first beam portion and the second beam portion, it is possible to suppress that heat generated in the light receiving portion escapes through the first beam portion and the second beam portion and to improve performance as the light detector.

Advantageous Effects of Invention

According to the present disclosure, it is possible to provide a light detector capable of suppressing an electrical connection error in a connection portion of a membrane, the connection portion to which an electrode post is connected.

BRIEF DESCRIPTION OF DRAWINGS

FIG. 8 is a diagram illustrating a method of manufacturing the light detecting element of FIG. 5.
FIG. 9 is a diagram illustrating a method of manufacturing the light detecting element of FIG. 5.
FIG. 10 is a diagram illustrating a method of manufacturing the light detecting element of FIG. 5.
FIG. 11 is a diagram illustrating a method of manufacturing the light detecting element of FIG. 5.
FIG. 13 is a diagram illustrating a method of manufacturing the light detecting element of FIG. 5.
FIG. 14 is a diagram illustrating a method of manufacturing the light detecting element of FIG. 5.
FIG. 15 is a diagram illustrating a method of manufacturing the light detecting element of FIG. 5.
FIG. 16 is a diagram illustrating a method of manufacturing the light detecting element of FIG. 5.
FIG. 17 is a diagram illustrating a method of manufacturing the light detecting element of FIG. 5.

DESCRIPTION OF EMBODIMENTS

Figure 1:
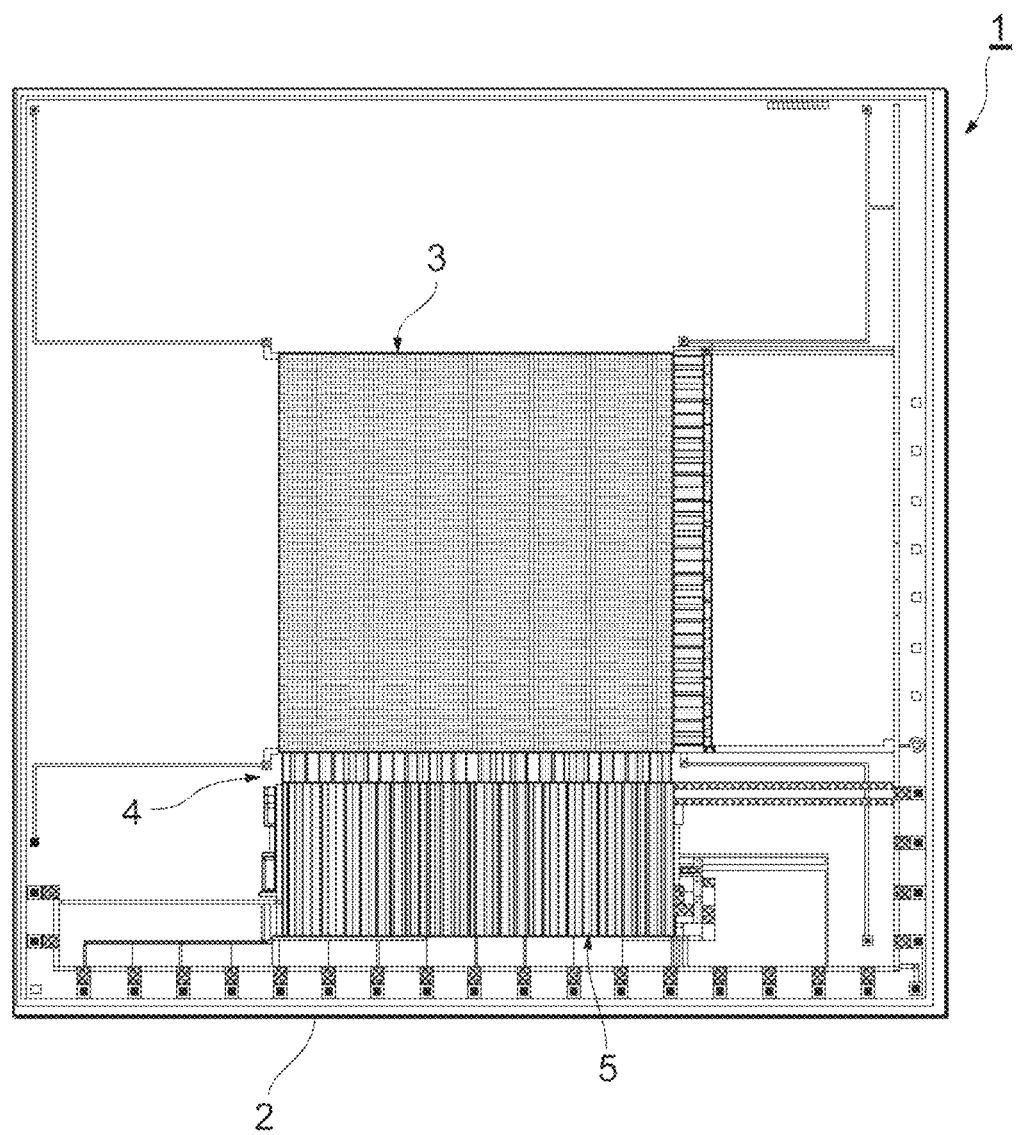
FIG. 1 is a plan view of a light detector of an embodiment.

Hereinafter, a preferred embodiment of the present disclosure will be described in detail with reference to the drawings. Additionally, the same reference numerals will be given to the same or equivalent parts in the drawings and a redundant description thereof will be omitted.

A light detector 1 illustrated in FIG. 1 detects light by using a function as a bolometer. The light is, for example, infrared rays including terahertz waves. When the light is infrared rays, the light detector 1 is used for an infrared imager, a thermography, or the like. The light detector 1 has excellent characteristics particularly for detecting light in a wavelength band of 1 μm to several tens of μm. As illustrated in FIG. 1, the light detector 1 includes a substrate 2, a pixel unit 3, a reference unit 4, and a signal processing circuit unit 5. The substrate 2 is, for example, a Si substrate. The thickness of the substrate 2 is, for example, about several hundreds of μm. The pixel unit 3, the reference unit 4, and the signal processing circuit unit 5 are formed on the substrate 2. Each of the pixel unit 3 and the reference unit 4 is electrically connected to the signal processing circuit unit 5. Additionally, the signal processing circuit unit 5 may be formed within the substrate 2.

Figure 2:
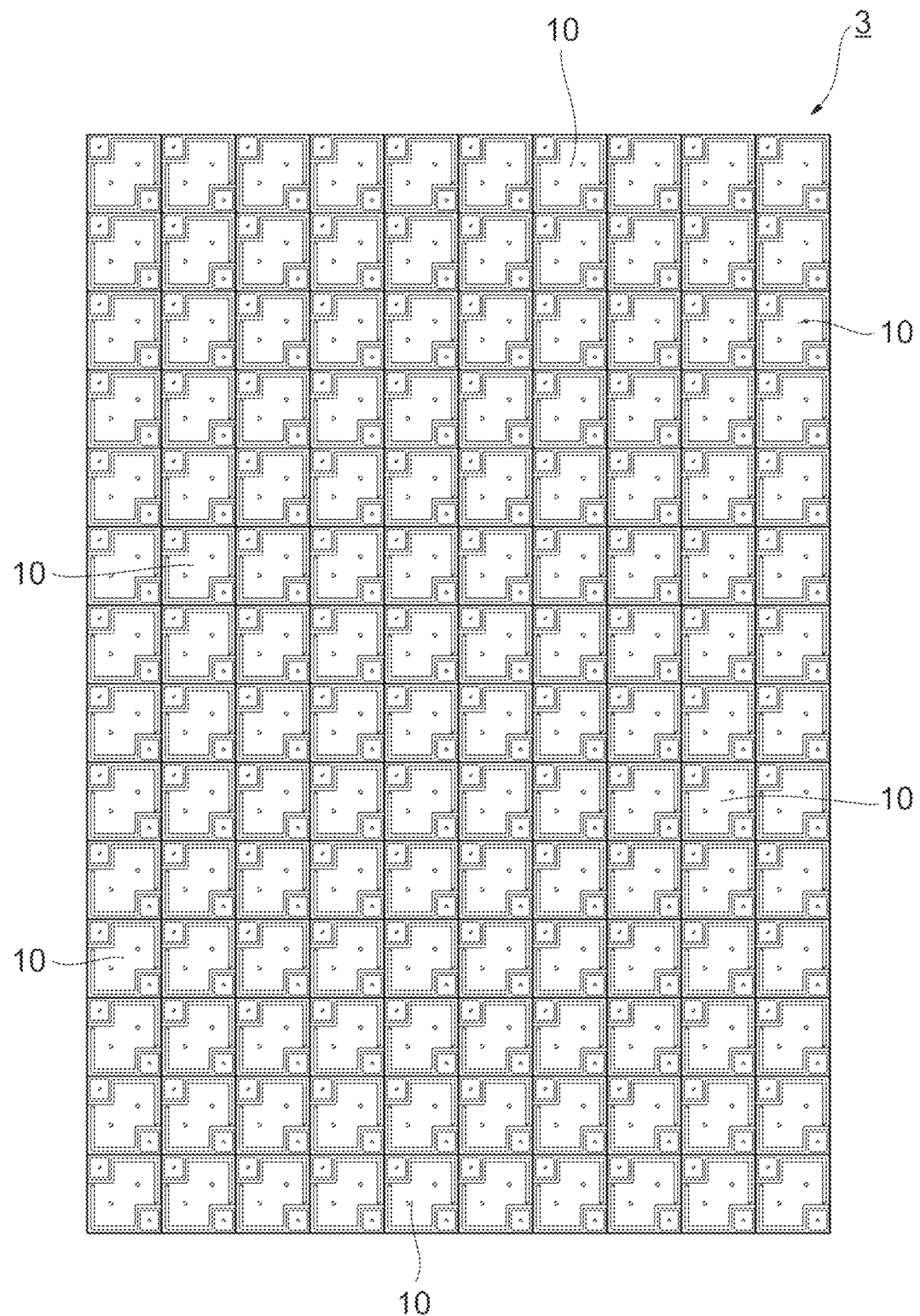
FIG. 2 is a plan view of a pixel unit of the light detector of FIG. 1.
Figure 3:
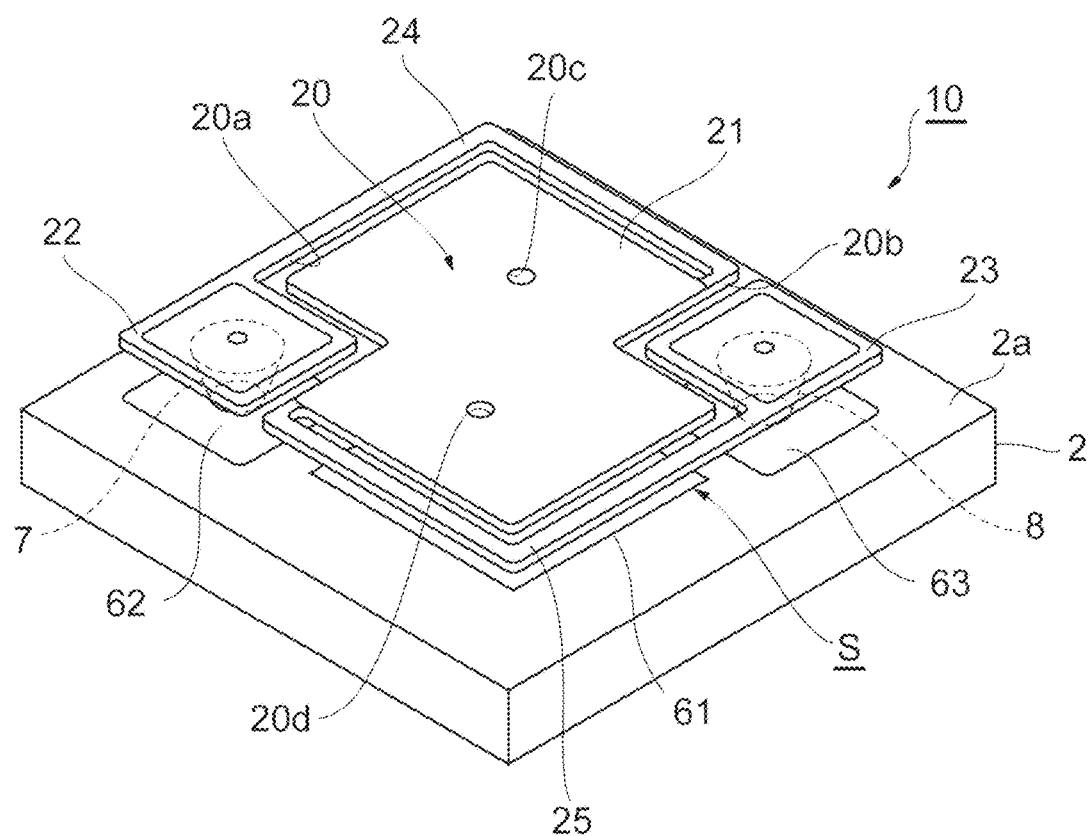
FIG. 3 is a perspective view of a light detecting element of the pixel unit of FIG. 2.

As illustrated in FIG. 2, the pixel unit 3 includes a plurality of light detecting elements 10. The plurality of light detecting elements 10 are arranged in a two-dimensional matrix shape. As illustrated in FIG. 3, the light detecting element 10 includes the substrate 2 (precisely, a part of the substrate 2), a light reflection layer 61, a first electrode pad 62, a second electrode pad 63, a membrane 20, a first electrode post 7, and a second electrode post 8.

The light reflection layer 61 is formed on a surface 2a of the substrate 2. The light reflection layer 61 faces a light absorption layer 36 to be described later in the thickness direction of the substrate 2 (that is, a direction perpendicular to the surface 2a of the substrate 2) and constitutes an optical resonance structure along with the light absorption layer 36. The thickness of the light reflection layer 61 is, for example, about several hundreds of nm. The material of the light reflection layer 61 is, for example, a metal material such as Al having high reflectivity with respect to light (for example, infrared rays).

The first electrode pad 62 and the second electrode pad 63 are formed on the surface 2a of the substrate 2. The light reflection layer 61, the first electrode pad 62, and the second electrode pad 63 form, for example, a rectangular outer shape when viewed from the thickness direction of the substrate 2. The first electrode pad 62 and the second electrode pad 63 are located diagonally in the outer shape. Each of the first electrode pad 62 and the second electrode pad 63 has, for example, a rectangular shape when viewed from the thickness direction of the substrate 2. Each of the first electrode pad 62 and the second electrode pad 63 is electrically connected to the signal processing circuit unit 5 through a wiring (not illustrated) formed on the substrate 2. The thickness of each of the first electrode pad 62 and the second electrode pad 63 is, for example, about several hundreds of nm. The material of each of the first electrode pad 62 and the second electrode pad 63 is, for example, a conductive metal material such as Al.

Figure 4:
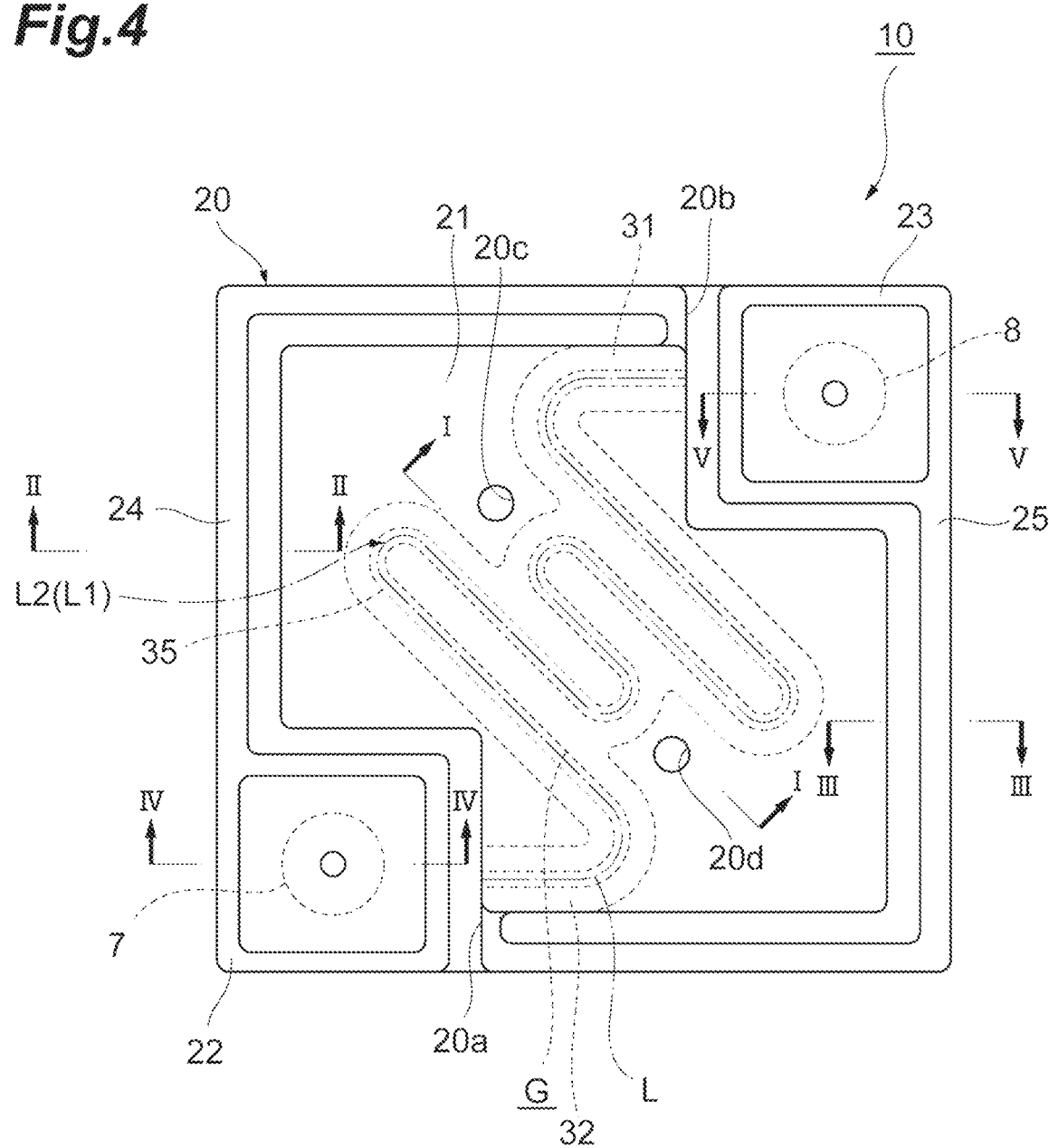
FIG. 4 is a plan view of the light detecting element of FIG. 3.

The membrane 20 is disposed on the surface 2a of the substrate 2 so as to fours a void space S between the membrane 20 and the surface 2a of the substrate 2. The membrane 20 is disposed in substantially parallel to the surface 2a of the substrate 2. A distance between the membrane 20 and the surface 2a of the substrate 2 is, for example, about several μm. As illustrated in FIGS. 3 and 4, the membrane 20 includes a light receiving portion 21, first and second connection portions 22 and 23, and first and second beam portions 24 and 25. The light receiving portion 21, the first and second connection portions 22 and 23, and the first and second beam portions 24 and 25 are integrally formed and form, for example, a rectangular outer shape when viewed from the thickness direction of the substrate 2. The first connection portion 22 and the second connection portion 23 are located diagonally in the outer shape. Each of the first connection portion 22 and the second connection portion 23 has, for example, a rectangular shape when viewed from the thickness direction of the substrate 2.

The light receiving portion 21 faces the light reflection layer 61 in the thickness direction of the substrate 2. The first connection portion 22 faces the first electrode pad 62 in the thickness direction of the substrate 2. The second connection portion 23 faces the second electrode pad 63 in the thickness direction of the substrate 2.

The first beam portion 24 is disposed between the light receiving portion 21 and the first connection portion 22. The first beam portion 24 extends along the outer edge of the light receiving portion 21 at one side of the light receiving portion 21. One end of the first beam portion 24 is connected to the first connection portion 22 and the other end of the first beam portion 24 is connected to the light receiving portion 21 at a position in the vicinity of the second connection portion 23. First slits 20a are continuously formed between the light receiving portion 21 and the first connection portion 22 and between the light receiving portion 21 and the first beam portion 24. The second beam portion 25 is disposed between the light receiving portion 21 and the second connection portion 23. The second beam portion 25 extends along the outer edge of the light receiving portion 21 at the other side of the light receiving portion 21. One end of the second beam portion 25 is connected to the second connection portion 23 and the other end of the second beam portion 25 is connected to the light receiving portion 21 at a position in the vicinity of the first connection portion 22. Second slits 20b are continuously formed between the light receiving portion 21 and the second connection portion 23 and between the light receiving portion 21 and the second beam portion 25. The width of each of the first beam portion 24 and the second beam portion 25 is, for example, about several μm. The length of each of the first beam portion 24 and the second beam portion 25 is, for example, about several tens to several hundreds of μm. The width of each of the first slit 20a and the second slit 20b is, for example, about several μm.

The first electrode post 7 is disposed between the first electrode pad 62 and the first connection portion 22. The first electrode post 7 supports the membrane 20 and electrically connects the membrane 20 to the first electrode pad 62. The second electrode post 8 is disposed between the second electrode pad 63 and the second connection portion 23. The second electrode post 8 supports the membrane 20 and electrically connects the membrane 20 to the second electrode pad 63. The height of each of the first electrode post 7 and the second electrode post 8 is, for example, about several μm. The material of each of the first electrode post 7 and the second electrode post 8 is, for example, a metal material such as Ti.

Figure 5:
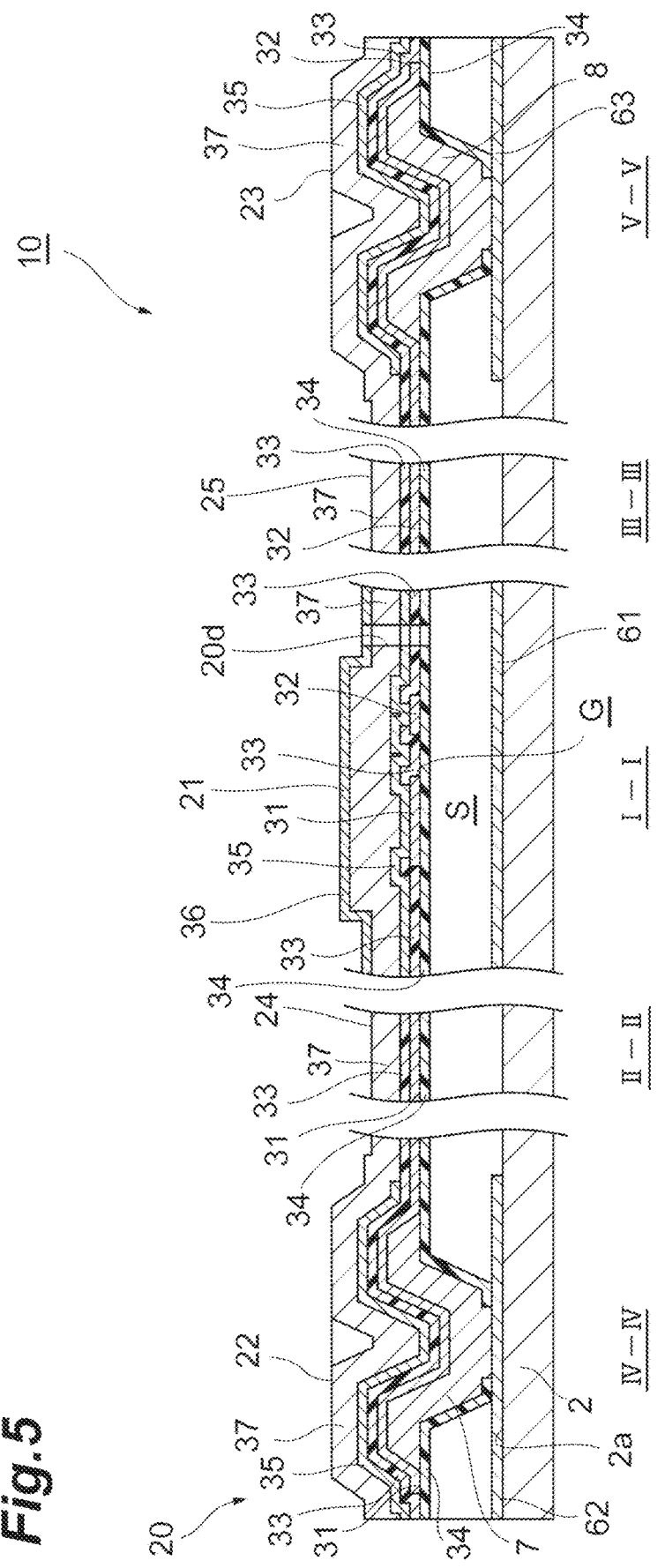
FIG. 5 is a cross-sectional view of the light detecting element of FIG. 3.

FIG. 5 is a cross-sectional view of the light detecting element 10. I-I, II-II, IV-IV, and V-V of FIG. 5 are respectively cross-sectional views taken along lines I-I, II-II, III-III, IV-IV, and V-V of FIG. 4. As illustrated in FIG. 5, the membrane 20 includes first and second wiring layers 31 and 32, first and second insulation layers 33 and 34, a resistance layer 35, a light absorption layer 36, and a separation layer 37.

As illustrated in FIGS. 4 and 5, the first wiring layer 31 and the second wiring layer 32 face each other through a gap G in the light receiving portion 21 when viewed from the thickness direction of the substrate 2. The gap G extends along the line L. For example, the line L extends in a meandering shape so as to connect the first connection portion 22 and the second connection portion 23 when viewed from the thickness direction of the substrate 2. Specifically, the line L includes a meandering portion L1. The meandering portion L1 includes a plurality of curved portions L2. The meandering portion L1 is formed in the light receiving portion 21 so as to repeat that extend to one side of the light receiving portion 21, turn back, for example, by 180° at the curved portion L2, extend to the other side of the light receiving portion 21, turn back, for example, by 180° at the curved portion L2, and extend to one side of the light receiving portion 21.

In this embodiment, one side means one side (for example, the existence side of the first beam portion 24) with respect to a line connecting the first connection portion 22 and the second connection portion 23 when viewed from the thickness direction of the substrate 2 and the other side means the side (for example, the existence side of the second beam portion 25) opposite to one side with respect to a line connecting the first connection portion 22 and the second connection portion 23 when viewed from the thickness direction of the substrate 2. Further, one side means one side (for example, the existence side of the first beam portion 24) with respect to a line passing through the center of geometric of the membrane 20 when viewed from the thickness direction of the substrate 2 and the other side means the side (the existence side of the second beam portion 25) opposite to one side with respect to a line passing through the center of geometric of the membrane 20 when viewed from the thickness direction of the substrate 2.

The length of each of the first wiring layer 31 and the second wiring layer 32 in a direction along the line L in the light receiving portion 21 when viewed from the thickness direction of the substrate 2 is, for example, about several tens to several hundreds of μm. The width of each of the first wiring layer 31 and the second wiring layer 32 in a direction perpendicular to the line L when viewed from the thickness direction of the substrate 2 is, for example, about several μm. The width of the gap G in a direction perpendicular to the line L when viewed from the thickness direction of the substrate 2 is, for example, about several μm. The direction perpendicular to the line L means a direction perpendicular to the tangent line at each position of the line L when viewed from the thickness direction of the substrate 2. The directions perpendicular to the line L are respectively different at respective positions of the curved portion. The thickness of each of the first wiring layer 31 and the second wiring layer 32 is, for example, about several tens to several hundreds of nm.

The first wiring layer 31 extends from the light receiving portion 21 to the first connection portion 22 through the first beam portion 24. The first wiring layer 31 is formed on the first electrode post 7 in the first connection portion 22. The first wiring layer 31 is electrically connected to the first electrode post 7. The second wiring layer 32 extends from the light receiving portion 21 to the second connection portion 23 through the second beam portion 25. The second wiring layer 32 is formed on the second electrode post 8 in the second connection portion 23. The second wiring layer 32 is electrically connected to the second electrode post 8. The material of each of the first wiring layer 31 and the second wiring layer 32 is, for example, a metal material such as Ti.

The first insulation layer 33 is formed across the light receiving portion 21, the first and second beam portions 24 and 25, and the first and second connection portions 22 and 23 so as to cover the surface at the side opposite to the substrate 2 in each of the first wiring layer 31 and the second wiring layer 32. The first insulation layer 33 is formed in the surface at the side opposite to the substrate 2 in the first wiring layer 31 and the second wiring layer 32 while exposing an area along the line L in the surface at the side opposite to the substrate 2 in each of the first wiring layer 31 and the second wiring layer 32. The second insulation layer 34 is formed across the light receiving portion 21, the first and second beam portions 24 and 25, and the first and second connection portions 22 and 23 so as to cover the surface at the side of the substrate 2 in each of the first wiring layer 31 and the second wiring layer 32. The thickness of each of the first insulation layer 33 and the second insulation layer 34 is, for example, about several tens of nm. The material of each of the first insulation layer 33 and the second insulation layer 34 is, for example, a silicon nitride film (SiN) or the like.

The resistance layer 35 is formed so as to cover the first insulation layer 33 from the opposite side of the substrate 2 in the light receiving portion 21. The resistance layer 35 contacts an area along the line L in the surface opposite to the substrate 2 in each of the first wiring layer 31 and the second wiring layer 32 in the light receiving portion 21. That is, the resistance layer 35 is electrically connected to each of the first wiring layer 31 and the second wiring layer 32 in the light receiving portion 21. The resistance layer 35 has an electrical resistance that depends on temperature. The thickness of the resistance layer 35 is, for example, about several tens to several hundreds of nm. The material of the resistance layer 35 is, for example, amorphous silicon (a-Si) having a large change in electrical resistivity due to a temperature change.

The light absorption layer 36 faces the surface 2a of the substrate 2 in the light receiving portion 21. The light absorption layer 36 is disposed at the side opposite to the substrate 2 with respect to the resistance layer 35. The light absorption layer 36 spreads over the entire area of the light receiving portion 21 when viewed from the thickness direction of the substrate 2. The thickness of the light absorption layer 36 is, for example, about a dozen of nm. The material of the light absorption layer 36 is, for example, $WSi_2$ or Ti.

The separation layer 37 is formed across the light receiving portion 21, the first and second beam portions 24 and 25, and the first and second connection portions 22 and 23 so as to be located between the resistance layer 35 and the light absorption layer 36 in the light receiving portion 21. The thickness of the separation layer 37 is larger than the thickness of each of the first wiring layer 31, the second wiring layer 32, the resistance layer 35, and the light absorption layer 36. The thickness of the separation layer 37 is, for example, about several hundreds of nm. The material of the separation layer 37 is, for example, a silicon nitride film (SiN) or the like.

The membrane 20 is provided with a plurality of through-holes 20c and 20d. The plurality of through-holes 20c and 20d are holes through which an etching gas for removing a sacrificial layer 69 to be described later passes. Each of the through-holes 20c and 20d has, for example, a circular shape when viewed from the thickness direction of the substrate 2. The diameter of each of the through-holes 20c and 20d is, for example, about several μm.

Next, configurations of the second electrode post 8 and the second connection portion 23 will be described in more detail with reference to FIG. 6. Additionally, since the configurations of the first electrode post 7 and the first connection portion 22 are the same as the configurations of the second electrode post 8 and the second connection portion 23, the configurations of the first electrode post 7 and the first connection portion 22 are indicated by parentheses and the description thereof is omitted in FIG. 6. I-I and V-V of FIG. 6 are respectively cross-sectional views taken along lines I-I and V-V of FIG. 4.

Figure 6:
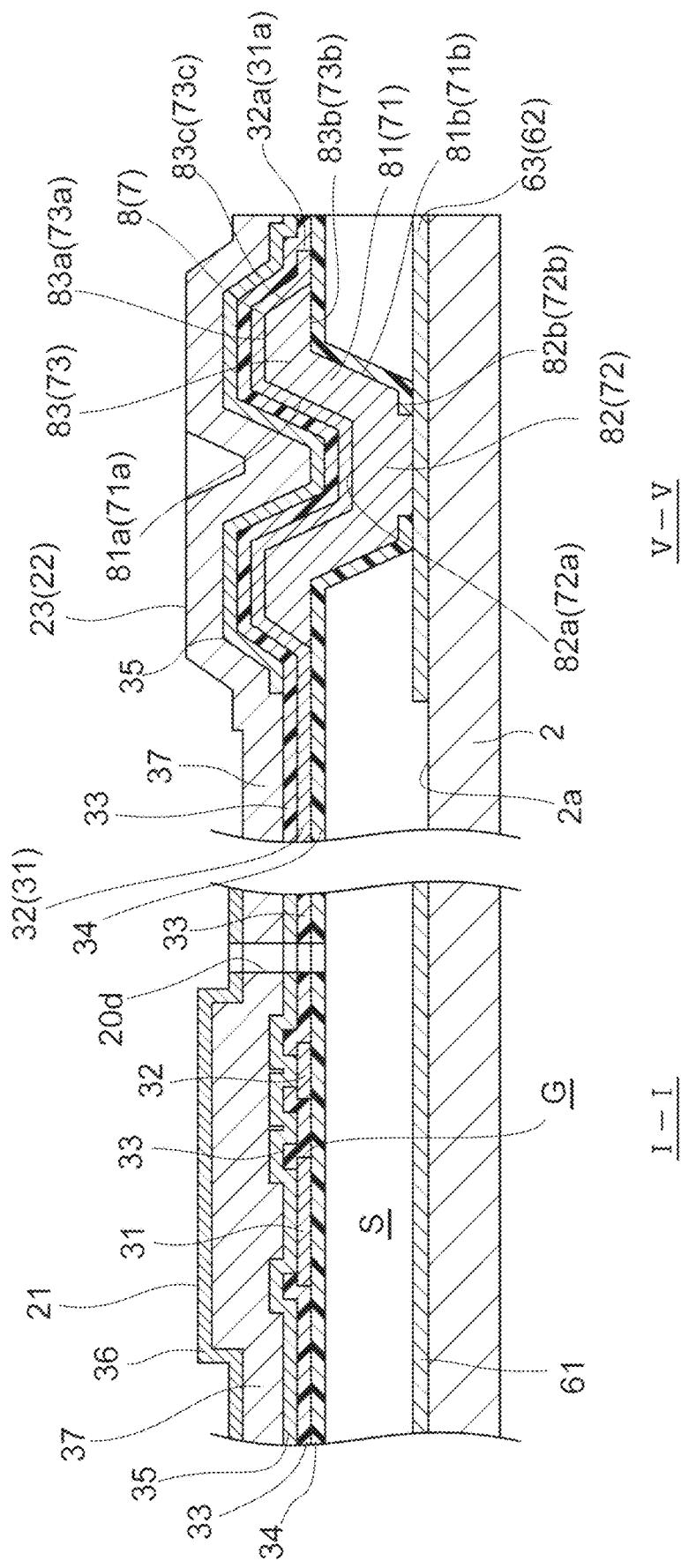
FIG. 6 is a cross-sectional view of the light detecting element of FIG. 3.

As illustrated in FIG. 6, the second electrode post 8 includes a second main body portion 81, a second bottom portion 82, and a second flange portion 83. The second main body portion 81, the second bottom portion 82, and the second flange portion 83 are integrally formed by, for example, a metal material such as Ti. The second main body portion 81 is formed in, for example, a tubular shape such as a cylindrical shape spreading from the second electrode pad 63 toward the side opposite to the substrate 2. Each of the inner surface 81a and the outer surface 81b of the second main body portion 81 is, for example, a truncated cone-shaped tapered surface.

The second bottom portion 82 is provided in an end portion at the side of the substrate 2 in the second main body portion 81. The second bottom portion 82 contacts the second electrode pad 63. An inner surface 82a of the second bottom portion 82 is, for example, a circular flat surface (a flat surface parallel to the surface 2a of the substrate 2) and is connected to the inner surface 81a of the second main body portion 81. The outer surface of the second bottom portion 82 is provided with a groove 82b extending in an annular shape along the outer edge of the outer surface of the second bottom portion 82. The groove 82b is defined by the second bottom portion 82 and the second electrode pad 63.

The second flange portion 83 is provided in an end portion at the side opposite to the substrate 2 in the second main body portion 81. The second flange portion 83 is formed in a flange shape facing outward. A surface 83a at the side opposite to the substrate 2 in the second flange portion 83 is, for example, a flat surface (a flat surface parallel to the surface 2a of the substrate 2) having a circular inner edge and a rectangular outer edge and is connected to the inner surface 81a of the second main body portion 81. A surface 83b at the side of the substrate 2 in the second flange portion 83 is, for example, a flat surface (a flat surface parallel to the surface 2a of the substrate 2) having a circular inner edge and a rectangular outer edge and is connected to the outer surface 81b of the second main body portion 81. In the second flange portion 83, the outer edge of the surface 83a is connected to the outer edge of the surface 83b by the second sloped surface 83c. That is, the second sloped surface 83c is provided in an annular shape along the outer edge of the second flange portion 83. The second sloped surface 83c is inclined so as to approach the substrate 2 in a direction perpendicular to the surface 2a of the substrate 2 as it goes away from the second main body portion 81 in a direction parallel to the surface 2a of the substrate 2. The second sloped surface 83c is, for example, a square frustum tapered surface.

The second wiring layer 32 extends to the second connection portion 23 through the second beam portion 25. The second wiring layer 32 reaches the inner surface 81a of the second main body portion 81 and the inner surface 82a of the second bottom portion 82 through the second sloped surface 83c and the surface 83a of the second flange portion 83 in the second connection portion 23. The second wiring layer 32 covers the second sloped surface 83c and the surface 83a of the second flange portion 83, the inner surface 81a of the second main body portion 81, and the inner surface 82a of the second bottom portion 82 in the second connection portion 23. Accordingly, the second wiring layer 32 is smoothly formed in the second connection portion 23 without being bent at a right angle or less.

The first insulation layer 33 covers the side surface 32a of the second wiring layer 32 in the second connection portion 23. In the second connection portion 23, the second insulation layer 34 enters the groove 82b on the second electrode pad 63 through the surface at the side of the substrate 2 in the second wiring layer 32, the surface 83b of the second flange portion 83, and the outer surface 81b of the second main body portion 81. That is, in the second connection portion 23, a part of the second insulation layer 34 is disposed between the second electrode post 8 and the second electrode pad 63. The resistance layer 35 is also provided in the second connection portion 23 as well as the light receiving portion 21. The resistance layer 35 is not formed in a portion excluding both end portions of the second beam portion 25. That is, the resistance layer 35 is divided in the second beam portion 25.

The configurations of the first electrode post 7 and the first connection portion 22 are respectively the same as the configurations of the second electrode post 8 and the second connection portion 23. Here, not the second wiring layer 32 but the first wiring layer 31 extends in the first connection portion 22. That is, the first electrode post 7 includes a first main body portion 71, a first bottom portion 72, and a first flange portion 73. The first main body portion 71, the first bottom portion 72, and the first flange portion 73 are integrally formed by, for example, a metal material such as Ti. The first main body portion 71 is formed in a tubular shape spreading from the first electrode pad 62 toward the side opposite to the substrate 2. The first bottom portion 72 is provided in an end portion at the side of the substrate 2 in the first main body portion 71. The first flange portion 73 is provided at an end portion at the side opposite to the substrate 2 in the first main body portion 71. The first flange portion 73 is provided with a first sloped surface 73c which is inclined so as to approach the substrate 2 as it goes away from the first main body portion 71. The first sloped surface 73c is provided in an annular shape along the outer edge of the first flange portion 73. The first wiring layer 31 extends to the first connection portion 22 through the first beam portion 24 and reaches an inner surface 71a of the first main body portion 71 and an inner surface 72a of the first bottom portion 72 through the first sloped surface 73c. The first wiring layer 31 covers the first sloped surface 73c, and the inner surface 71a of the first main body portion 71, and the inner surface 72a of the first bottom portion 72. The first insulation layer 33 covers the side surface 31a of the first wiring layer 31 in the first connection portion 22. The second insulation layer 34 enters a groove 72b formed on the outer surface of the first bottom portion 72 on the first electrode pad 62 through an outer surface 71b of the first main body portion 71. The resistance layer 35 is also provided in the first connection portion 22 as well as the light receiving portion 21. The resistance layer 35 is not formed in a portion excluding both end portions of the first beam portion 24. That is, the resistance layer 35 is divided in the first beam portion 24.

In the light detector 1 with the above-described configuration, light is detected as below. First, when light is incident to the light receiving portion 21, heat is generated in the light absorption layer 36 constituting an optical resonance structure to be described later. At this time, the light receiving portion 21 and the substrate 2 are thermally separated from one another by the void space S. Further, the light receiving portion 21, the first connection portion 22, and the first beam portion 24 are thermally separated from one another by the first slit 20a. Further, the light receiving portion 21, the second connection portion 23, and the second beam portion 25 are thermally separated from one another by the second slit 20b. For this reason, it is possible to suppress that heat generated in the light absorption layer 36 escapes to the substrate 2 through the first beam portion 24, the first connection portion 22, the second beam portion 25, and the second connection portion 23. Further, the light absorption layer 36, the first wiring layer 31, and the second wiring layer 32 are thermally separated from one another by the separation layer 37. For this reason, it is possible to suppress that heat generated in the light absorption layer 36 escapes to the substrate 2 through the first wiring layer 31 and the second wiring layer 32 before the heat is sufficiently transmitted to the resistance layer 35 through the separation layer 37.

Heat generated in the light absorption layer 36 is transmitted to the resistance layer 35 through the separation layer 37. Then, the temperature of the resistance layer 35 increases and the electrical resistance thereof decreases due to the heat. A change in electrical resistance is transmitted as a signal to the signal processing circuit unit 5 through the first and second wiring layers 31 and 32 and the first and second electrode posts 7 and 8. In the signal processing circuit unit 5, a change in electrical resistance of the resistance layer 35 is converted into a change in voltage or current. At this time, a change in electrical resistance is transmitted as a signal also from the reference element of the reference unit 4 to the signal processing circuit unit 5. In the signal processing circuit unit 5, a change in electrical resistance of the resistance layer of the reference element is converted into a change in voltage or current. The reference element is an element for compensating a change in temperature due to a factor other than the receiving of light in the light detecting element 10. In the signal processing circuit unit 5, light is detected on the basis of a difference between a change in voltage or current by the light detecting element 10 and a change in voltage or current by the reference element.

Figure 7:
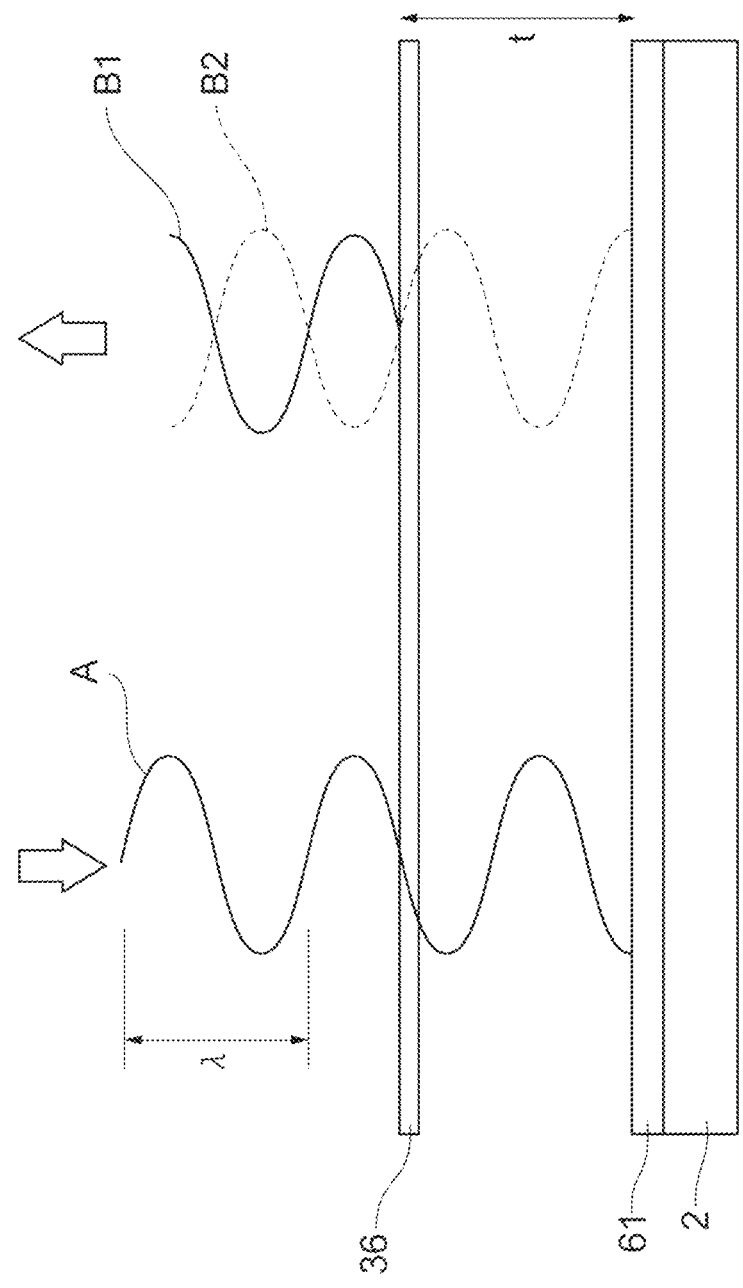
FIG. 7 is a diagram illustrating a principle of an optical resonance structure.

Next, an optical resonance structure will be described in detail. As illustrated in FIG. 7, a part of incident light A (having a wavelength λ) incident to the light absorption layer 36 is reflected by the light absorption layer 36 as reflected light B1 and the other is transmitted through the light absorption layer 36. Another part of the incident light A transmitted through the light absorption layer 36 is reflected by the light reflection layer 61 as reflected light B2. Then, the reflected light B1 and the reflected light B2 are canceled by interference with each other on the reflecting surface of the light absorption layer 36. Accordingly, the incident light A is absorbed in the reflecting surface of the light absorption layer 36. Heat is generated in the light absorption layer 36 due to the energy of the absorbed incident light A.

The absorption rate of the incident light A is determined by the sheet resistance of the light absorption layer 36 and the optical distance t between the light absorption layer 36 and the light reflection layer 61. The thickness of the light absorption layer 36 is set to about 16 nm so that the sheet resistance becomes a vacuum impedance (Ω/sq) (when the material of the light absorption layer 36 is $WSi_2$). Accordingly, the amplitude of the reflected light B1 reflected by the light absorption layer 36 matches the amplitude of the reflected light B2 reflected by the light reflection layer 61. For this reason, the reflected light B1 and the reflected light B2 are efficiently canceled by interference with each other on the reflecting surface of the light absorption layer 36. Thus, the absorption rate of the incident light A is improved.

Further, the optical distance t is set so as to satisfy t=(2 m−1)λ=4(m=1, 2, 3, . . . ). Accordingly, the phases of the reflected light B1 and the reflected light B2 are shifted by 180°. For this reason, the reflected light B1 and the reflected light B2 are efficiently canceled by interference with each other on the reflecting surface of the light absorption layer 36. Thus, the absorption rate of the incident light A is improved. In this way, the light reflection layer 61 constitutes an optical resonance structure along with the light absorption layer 36. The incident light A is efficiently absorbed as the area of the overlapping portion between the light reflection layer 61 and the light absorption layer 36 becomes wider when viewed from the thickness direction of the substrate 2.

As described above, in the light detector 1, the first main body portion 71 of the first electrode post 7 has a tubular shape spreading from the first electrode pad 62 toward the side opposite to the substrate 2. For this reason, stress concentration hardly occurs in the first connection portion 22 in the membrane 20. The same applies to the second electrode post 8 and stress concentration hardly occurs in the second connection portion 23. Further, the first main body portion 71 of the first electrode post 7 is provided with the first flange portion 73. For this reason, deformation hardly occurs in the first connection portion 22. The same applies to the second electrode post 8 and deformation hardly occurs in the second connection portion 23. Further, the first wiring layer 31 reaches the inner surface 71a of the first main body portion 71 through the first sloped surface 73c provided in the first flange portion 73. For this reason, stress concentration hardly occurs in the first wiring layer 31 itself in the first connection portion 22. The same applies to the second electrode post 8 and stress concentration hardly occurs in the second wiring layer 32 itself in the second connection portion 23. Further, the first wiring layer 31 reaches not only the inner surface 71a of the first main body portion 71 but also the inner surface 72a of the first bottom portion 72 through the first sloped surface 73c. Accordingly, it is possible to secure the electrical connection between the first wiring layer 31 and the first electrode post 7. The same applies to the second electrode post 8 and the electrical connection between the second wiring layer 32 and the second electrode post 8 can be secured.

As described above, according to the light detector 1, it is possible to suppress an electrical connection error in each of the first connection portion 22 and the second connection portion 23 respectively connected to the first electrode post 7 and the second electrode post 8 in the membrane 20. Further, according to the light detector 1, the thickness of the first electrode post 7 and the second electrode post 8 can be thickened and the thickness of the first wiring layer 31 and the second wiring layer 32 can be thinned. Accordingly, it is possible to reinforce the first electrode post 7 and the second electrode post 8 and to reduce the thermal conductance of the first wiring layer 31 and the second wiring layer 32 at the same time.

Further, in the light detector 1, the first sloped surface 73c is provided in an annular shape along the outer edge of the first flange portion 73, the first wiring layer 31 covers the first sloped surface 73c and the inner surface 71a of the first main body portion 71, the second sloped surface 83c is provided in an annular shape along the outer edge of the second flange portion 83, and the second wiring layer 32 covers the second sloped surface 83c and the inner surface 81a of the second main body portion 81. According to this configuration, it is possible to further secure the electrical connection between the first wiring layer 31 and the first electrode post 7 and the electrical connection between the second wiring layer 32 and the second electrode post 8.

Further, in the light detector 1, the first insulation layer 33 covers each of the side surface 31a of the first wiring layer 31 and the side surface 32a of the second wiring layer 32 in each of the first connection portion 22 and the second connection portion 23. According to this configuration, it is possible to prevent the separation of the first wiring layer 31 in the first connection portion 22 and the separation of the second wiring layer 32 in the second connection portion 23 while protecting the first wiring layer 31 and the second wiring layer 32 from the side opposite to the substrate 2.

Further, in the light detector 1, the second insulation layer 34 enters the groove 72b formed in the outer surface of the first bottom portion 72 on the first electrode pad 62 through the outer surface 71b of the first main body portion 71 of the first electrode post 7 in the first connection portion 22 and the second insulation layer 34 enters the groove 82b formed in the outer surface of the second bottom portion 82 on the second electrode pad 63 through the outer surface 81b of the second main body portion 81 of the second electrode post 8 in the second connection portion 23. According to this configuration, it is possible to prevent the separation of the second insulation layer 34 on the first electrode pad 62 or the exposure of the outer surface 71b of the first electrode post 7 and the separation of the second insulation layer 34 on the second electrode pad 63 or the exposure of the outer surface 81b of the second electrode post 8 while protecting the first wiring layer 31 and the second wiring layer 32 from the substrate 2.

Further, in the light detector 1, the resistance layer 35 is provided in the light receiving portion 21, the first connection portion 22, and the second connection portion 23 and is divided in each of the first beam portion 24 and the second beam portion 25. According to this configuration, since the first connection portion 22 and the second connection portion 23 are reinforced by the resistance layer 35, it is possible to more reliably suppress an electrical connection error in each of the first connection portion 22 and the second connection portion 23 respectively connected to the first electrode post 7 and the second electrode post 8 in the membrane 20. Further, since the resistance layer 35 is divided in the first beam portion 24 and the second beam portion 25, it is possible to suppress that heat generated in the light receiving portion 21 escapes through the first beam portion 24 and the second beam portion 25 and to improve performance as the light detector 1.

Next, a method of manufacturing the light detecting element 10 will be described with reference to FIGS. 8 to 17. In the drawings of FIGS. 8 to 14 and FIG. 17, I-I, II-II, III-III, IV-IV, and V-V of (b) are respectively cross-sectional views taken along lines I-I, II-II, III-III, IV-IV, and V-V of (a). In FIGS. 15 and 16, the drawings as in (a) are omitted.

First, as illustrated in FIG. 8, the substrate 2 is prepared and the light reflection layer 61, the first electrode pad 62, and the second electrode pad 63 are formed on the surface 2a of the substrate 2. The light reflection layer 61, the first electrode pad 62, and the second electrode pad 63 are formed in the above-described shape by etching. Next, as illustrated in FIG. 9, the sacrificial layer 69 is formed on the surface 2a of the substrate 2 so as to cover the light reflection layer 61, the first electrode pad 62, and the second electrode pad 63. The material of the sacrificial layer 69 is, for example, polyimide or the like. Next, as illustrated in FIG. 10, a part of the sacrificial layer 69 is removed by etching so as to form through-holes 69a and 69b in the sacrificial layer 69. The through-holes 69a and 69b are respectively formed on the first electrode pad 62 and the second electrode pad 63. Then, in each of the through-holes 69a and 69b, the surface at the side opposite to the substrate 2 in each of the first electrode pad 62 and the second electrode pad 63 is exposed. Each of the inner surfaces of the through-holes 69a and 69b is, for example, a truncated cone-shaped tapered surface. Each of the inner surfaces of the through-holes 69a and 69b spreads from each of the first electrode pad 62 and the second electrode pad 63 toward the side opposite to the substrate 2.

Next, as illustrated in FIG. 11, the second insulation layer 34 is formed on the sacrificial layer 69. The second insulation layer 34 is formed so that the inner surface of each of the through-holes 69a and 69b becomes, for example, a truncated cone-shaped tapered surface. Next, a part of the second insulation layer 34 is removed by etching so as to form the through-holes 34a and 34b in the second insulation layer 34. The through-holes 34a and 34b are respectively formed on the first electrode pad 62 and the second electrode pad 63. Then, in each of the through-holes 34a and 34b, the surface at the side opposite to the substrate 2 in each of the first electrode pad 62 and the second electrode pad 63 is exposed. Each of the through-holes 34a and 34b has a circular shape when viewed from the thickness direction of the substrate 2.

Figure 12:
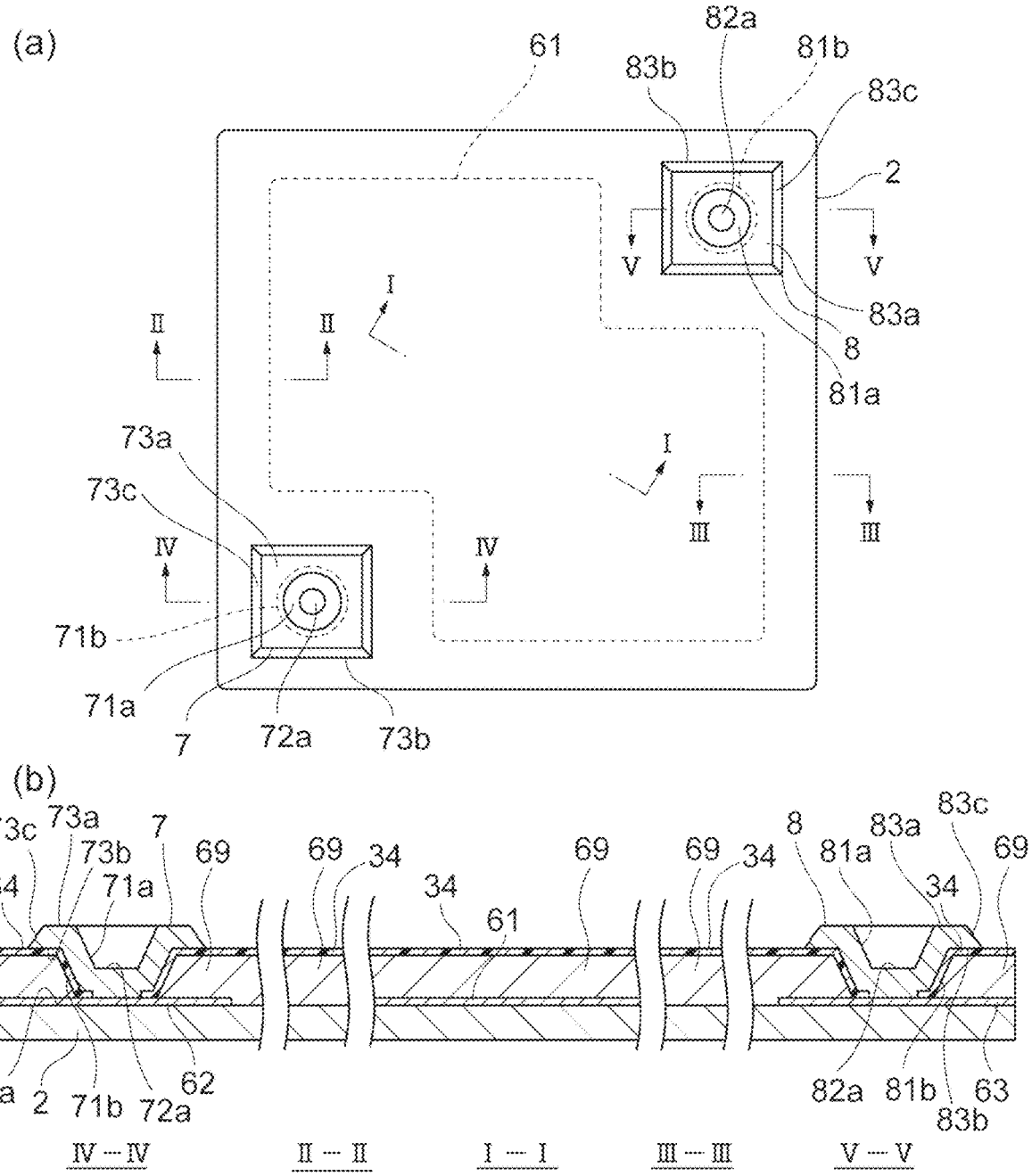
FIG. 12 is a diagram illustrating a method of manufacturing the light detecting element of FIG. 5.

Next, as illustrated in FIG. 12, the first electrode post 7 is formed on the second insulation layer 34 in the through-hole 69a and the second electrode post 8 is formed on the second insulation layer 34 in the through-hole 69b. Each of the first electrode post 7 and the second electrode post 8 is formed by, for example, vapor deposition. At this time, since the inner surface of each of the through-holes 69a and 69b in the second insulation layer 34 is a tapered surface, each of the first electrode post 7 and the second electrode post 8 is more reliably formed. Accordingly, a disconnection due to poor film formation of the first electrode post 7 and the second electrode post 8 is suppressed. Thus, it is possible to suppress an electrical connection error in each of the first connection portion 22 and the second connection portion 23. Further, a variation in thickness of each of the first electrode post 7 and the second electrode post 8 is suppressed and the strength is stabilized. Moreover, since the second insulation layer 34 includes a portion entering each of the groove 72b and the groove 82b in each of the first connection portion 22 and the second connection portion 23, the allowable range of misalignment between the first electrode post 7 and the second electrode post 8 is widened.

Next, as illustrated in FIG. 13, the first wiring layer 31 and the second wiring layer 32 are formed on the second insulation layer 34 so as to cover the first electrode post 7 and the second electrode post 8. Each of the first wiring layer 31 and the second wiring layer 32 is formed by, for example, vapor deposition. At this time, since the first sloped surface 73c of the first flange portion 73, the inner surface 71a of the first main body portion 71, the second sloped surface 83c of the second flange portion 83, and the inner surface 81a of the second main body portion 81 are tapered surfaces, the first wiring layer 31 and the second wiring layer 32 are more reliably formed on the first electrode post 7 and the second electrode post 8. Accordingly, a disconnection due to poor film formation of the first wiring layer 31 and the second wiring layer 32 is suppressed. Thus, it is possible to suppress an electrical connection error in each of the first connection portion 22 and the second connection portion 23. Further, a variation in thickness of each of the first wiring layer 31 and the second wiring layer 32 is suppressed and the strength is stabilized. Additionally, in a case in which the plurality of light detecting elements 10 are arranged in a two-dimensional matrix shape, an effect of more reliably forming the first and second electrode posts 7 and 8 and the first and second wiring layers 31 and 32 is particularly noticeable when the aspect ratio of the first electrode post 7 and the second electrode post 8 is increased in order to reduce a pixel pitch and a dead space. The first wiring layer 31 and the second wiring layer 32 are formed in the above-described shape by etching.

Next, as illustrated in FIG. 14, the first insulation layer 33 is formed across the light receiving portion 21, the first and second beam portions 24 and 25, and the first and second connection portions 22 and 23 so as to cover the first wiring layer 31 and the second wiring layer 32 from the side opposite to the substrate 2. The first insulation layer 33 is formed in the above-described shape by etching. At this time, since the first insulation layer 33 covers the side surface 31a of the first wiring layer 31 and the side surface 32a of the second wiring layer 32, the number of exposed dissimilar materials interfaces is small. Accordingly, etching defects caused by the interface can be reduced in the manufacturing process of the light detecting element 10. Further, since the type of material exposed to the outside is reduced, the degree of freedom in selecting an etching gas or an etching solution is improved. Next, as illustrated in FIG. 15, the resistance layer 35 is formed so as to cover the first insulation layer 33 from the side opposite to the substrate 2 in the light receiving portion 21 and the resistance layer 35 is formed on the first insulation layer 33 in the first connection portion 22 and the second connection portion 23. Then, the separation layer 37 is formed so as to cover the resistance layer 35 from the side opposite to the substrate 2 in the light receiving portion 21, the first connection portion 22, and the second connection portion 23 and the separation layer 37 is formed on the first insulation layer 33 in the first beam portion 24 and the second beam portion 25.

Next, as illustrated in FIG. 16, the light absorption layer 36 is formed on the separation layer 37 in the light receiving portion 21 and the through-holes 20c and 20d are further formed. The light absorption layer 36 is formed in the above-described shape by etching. The through-holes 20c and 20d are formed at the above-described positions by etching. Next, as illustrated in FIG. 17, the first slit 20a and the second slit 20b are formed and etching is further performed from the first slit 20a, the second slit 20b, and the through-holes 20c and 20d so as to remove the sacrificial layer 69 so that the void space S is formed. The first slit 20a and the second slit 20b are formed at the above-described positions by etching.

As described above, an embodiment of the present disclosure has been described, but the present disclosure is not limited to the above-described embodiment.

In the above-described embodiment, an example in which the second wiring layer 32 reaches the inner surface 81a of the second main body portion 81 and the inner surface 82a of the second bottom portion 82 has been described, but the second wiring layer 32 may not reach the inner surface 82a of the second bottom portion 82. The second wiring layer 32 may reach the inner surface 81a of the second main body portion 81 through the second sloped surface 83c of the second flange portion 83 in the second connection portion 23. The same applies to the first wiring layer 31 and the first wiring layer 31 may not reach the inner surface 72a of the first bottom portion 72. The first wiring layer 31 may reach the inner surface 71a of the first main body portion 71 through the first sloped surface 73c of the first flange portion 73 in the first connection portion 22.

In the above-described embodiment, an example in which the second sloped surface 83c is provided in an annular shape along the outer edge of the second flange portion 83 has been described, but the second sloped surface 83c may be provided, for example, only in a part of the outer edge of the second flange portion 83. Further, the second wiring layer 32 may not cover the second sloped surface 83c, and the inner surface 81a of the second main body portion 81, and the inner surface 72a of the second bottom portion 82. The second wiring layer 32 may reach the inner surface 81a of the second main body portion 81 through the second sloped surface 83c. The same applies to the first electrode post 7 and the first sloped surface 73c may be provided, for example, only in a part of the outer edge of the first flange portion 73. Further, the first wiring layer 31 may not cover the first sloped surface 73c, and the inner surface 71a of the first main body portion 71, and the inner surface 72a of the first bottom portion 72. The first wiring layer 31 may reach the inner surface 71a of the first main body portion 71 through the first sloped surface 73c.

Further, an example in which each of the inner surface 81a and the outer surface 81b of the second main body portion 81 is a truncated cone-shaped tapered surface has been described, but each of the inner surface 81a and the outer surface 81b of the second main body portion 81 may be, for example, a square frustum tapered surface. The same applies to the first main body portion 71 and each of the inner surface 71a and the outer surface 71b of the first main body portion 71 may be, for example, a square frustum tapered surface.

Further, an example in which the inner edge of the surface 83a at the side opposite to the substrate 2 in the second flange portion 83 has a circular shape and the outer edge thereof has a rectangular shape has been described, but each of the inner edge and the outer edge of the surface 83a may have, for example, a circular shape or a rectangular shape. Further, an example in which the inner edge of the surface 83b at the side of the substrate 2 in the second flange portion 83 has a circular shape and the outer edge thereof has a rectangular shape has been described, but each of the inner edge and the outer edge of the surface 83b may have, for example, a circular shape or a rectangular shape. The same applies to the first flange portion 73 and each of the inner edge and the outer edge of the surface 73a may have, for example, a circular shape or a rectangular shape. Further, each of the inner edge and the outer edge of the surface 73b may have, for example, a circular shape or a rectangular shape.

Further, an example in which the membrane 20 has, for example, a rectangular shape when viewed from the thickness direction of the substrate 2 has been described, but the present disclosure is not limited thereto. The membrane 20 may have, for example, various shapes such as a circular shape when viewed from the thickness direction of the substrate 2.

Further, various materials and thicknesses can be selected for each of the first and second wiring layers 31 and 32, the resistance layer 35, the light absorption layer 36, and the separation layer 37. It is possible to easily improve the sensitivity and to improve the strength of the membrane 20 by selecting the optimum material and thickness for each of the first and second wiring layers 31 and 32, the resistance layer 35, and the separation layer 37. Further, it is possible to improve both sensitivity and response speed by selecting the optimum material for each of the first and second wiring layers 31 and 32 and the light absorption layer 36.

Further, the through-holes 20c and 20d may have various shapes such as an oval shape or a square shape when viewed from the thickness direction of the substrate 2. Further, the formation positions of the through-holes 20c and 20d are not limited. The through-holes 20c and 20d may be formed at various positions of the light receiving portion 21.

Further, the pixel unit 3 may be configured as one light detecting element 10.

REFERENCE SIGNS LIST

1: light detector, 2: substrate, 2*a*: surface, 7: first electrode post, 8: second electrode post, 20: membrane, 21: light receiving portion, 22: first connection portion, 23: second connection portion, 24: first beam portion, 25: second beam portion, 31: first wiring layer, 31*a*: side surface, 32: second wiring layer, 32*a*: side surface, 33: first insulation layer, 34: second insulation layer, 35: resistance layer, 62: first electrode pad, 63: second electrode pad, 71: first main body portion, 71*a*: inner surface, 71*b*: outer surface, 72: first bottom portion, 72*a*: inner surface, 72*b*: groove, 73: first flange portion, 73*c*: first sloped surface, 81: second main body portion, 81*a*: inner surface, 81*b*: outer surface, 82: second bottom portion, 82*a*: inner surface, 82*b*: groove, 83: second flange portion, 83*c*: second sloped surface, G: gap, S: void space.

The invention claimed is:

1. A light detector comprising:
a substrate;
a membrane which includes a light receiving portion, first and second connection portions, a first beam portion disposed between the light receiving portion and the first connection portion, and a second beam portion disposed between the light receiving portion and the second connection portion and is disposed on a surface of the substrate so that a void space is formed between the membrane and the surface of the substrate;
a first electrode pad which is formed on the surface of the substrate;
a second electrode pad which is formed on the surface of the substrate;
a first electrode post which is disposed between the first electrode pad and the first connection portion so as to support the membrane and to electrically connect the membrane to the first electrode pad; and
a second electrode post which is disposed between the second electrode pad and the second connection portion so as to support the membrane and to electrically connect the membrane to the second electrode pad,
wherein the membrane includes first and second wiring layers facing each other with a gap interposed therebetween in the light receiving portion and a resistance layer having an electrical resistance depending on a temperature and electrically connected to each of the first and second wiring layers in the light receiving portion,
wherein the first electrode post includes a first main body portion having a tubular shape spreading from the first electrode pad toward the side opposite to the substrate, a first bottom portion provided in an end portion at the side of the substrate in the first main body portion, and a first flange portion provided in an end portion at the side opposite to the substrate in the first main body portion,
wherein the first flange portion is provided with a first sloped surface inclined so as to approach the substrate as it goes away from the first main body portion,
wherein the first wiring layer extends to the first connection portion via the first beam portion and reaches an inner surface of the first main body portion via the first sloped surface,
wherein the second electrode post includes a second main body portion having a tubular shape spreading from the second electrode pad toward the side opposite to the substrate, a second bottom portion provided in an end portion at the side of the substrate in the second main body portion, and a second flange portion provided in an end portion at the side opposite to the substrate in the second main body portion,
wherein the second flange portion is provided with a second sloped surface inclined so as to approach the substrate as it goes away from the second main body portion, and
wherein the second wiring layer extends to the second connection portion via the second beam portion and reaches an inner surface of the second main body portion via the second sloped surface.

2. The light detector according to claim 1,
wherein the first wiring layer reaches the inner surface of the first main body portion and an inner surface of the first bottom portion via the first sloped surface, and
wherein the second wiring layer reaches the inner surface of the second main body portion and an inner surface of the second bottom portion via the second sloped surface.

3. The light detector according to claim 1,
wherein the first sloped surface is provided in an annular shape along an outer edge of the first flange portion,
wherein the first wiring layer covers the first sloped surface and the inner surface of the first main body portion,
wherein the second sloped surface is provided in an annular shape along an outer edge of the second flange portion, and
wherein the second wiring layer covers the second sloped surface and the inner surface of the second main body portion.

4. The light detector according to claim 1,
wherein the membrane further includes a first insulation layer formed on a surface at the side opposite to the substrate in the first wiring layer and the second wiring layer, and
wherein the first insulation layer covers a side surface of the first wiring layer in the first connection portion and covers a side surface of the second wiring layer in the second connection portion.

5. The light detector according to claim 1,
wherein the membrane further includes a second insulation layer formed on a surface at the side of the substrate in the first wiring layer and the second wiring layer, and
wherein the second insulation layer enters a groove formed in an outer surface of the first bottom portion on the first electrode pad via an outer surface of the first main body portion and enters a groove formed in an outer surface of the second bottom portion on the second electrode pad via an outer surface of the second main body portion.

6. The light detector according to claim 1,
wherein the resistance layer is provided in the light receiving portion, the first connection portion, and the second connection portion and is divided in each of the first beam portion and the second beam portion.

7. A light detector comprising:
a substrate;
a membrane which includes a light receiving portion, first and second connection portions, a first beam portion disposed between the light receiving portion and the first connection portion, and a second beam portion disposed between the light receiving portion and the second connection portion and is disposed on a surface of the substrate so that a void space is formed between the membrane and the surface of the substrate;

a first electrode pad which is formed on the surface of the substrate;

a second electrode pad which is formed on the surface of the substrate;

a first electrode post which is disposed between the first electrode pad and the first connection portion so as to support the membrane and to electrically connect the membrane to the first electrode pad; and a second electrode post which is disposed between the second electrode pad and the second connection portion so as to support the membrane and to electrically connect the membrane to the second electrode pad, wherein the membrane includes first and second wiring layers facing each other with a gap interposed therebetween in the light receiving portion and a resistance layer having an electrical resistance depending on a temperature and electrically connected to each of the first and second wiring layers in the light receiving portion, wherein the first electrode post includes a first main body portion having a tubular shape spreading from the first electrode pad toward the side opposite to the substrate, a first bottom portion provided in an end portion at the side of the substrate in the first main body portion, and a first flange portion provided in an end portion at the side opposite to the substrate in the first main body portion, wherein the first flange portion is provided with a first sloped surface inclined so as to approach the substrate as it goes away from the first main body portion, wherein the first wiring layer extends to the first connection portion via the first beam portion and rises up onto the first sloped surface so as to go away from the substrate as it approaches the first main body portion, wherein the second electrode post includes a second main body portion having a tubular shape spreading from the second electrode pad toward the side opposite to the substrate, a second bottom portion provided in an end portion at the side of the substrate in the second main body portion, and a second flange portion provided in an end portion at the side opposite to the substrate in the second main body portion, wherein the second flange portion is provided with a second sloped surface inclined so as to approach the substrate as it goes away from the second main body portion, and wherein the second wiring layer extends to the second connection portion via the second beam portion and rises up onto the second sloped surface so as to go away from the substrate as it approaches the second main body portion.

* * * * *